(12) United States Patent
Yu

(10) Patent No.: US 11,937,470 B2
(45) Date of Patent: Mar. 19, 2024

(54) ARRAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Pengfei Yu, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 436 days.

(21) Appl. No.: 17/267,883

(22) PCT Filed: May 7, 2020

(86) PCT No.: PCT/CN2020/089069
§ 371 (c)(1),
(2) Date: Feb. 11, 2021

(87) PCT Pub. No.: WO2021/223190
PCT Pub. Date: Nov. 11, 2021

(65) Prior Publication Data
US 2022/0115485 A1    Apr. 14, 2022

(51) Int. Cl.
*H10K 59/131* (2023.01)
*H10K 59/121* (2023.01)
*H10K 59/35* (2023.01)

(52) U.S. Cl.
CPC ....... *H10K 59/131* (2023.02); *H10K 59/1213* (2023.02); *H10K 59/1216* (2023.02); *H10K 59/353* (2023.02); *G09G 2310/0297* (2013.01)

(58) Field of Classification Search
None
See application file for complete search history.

(56) References Cited

U.S. PATENT DOCUMENTS

| 2017/0092178 A1* | 3/2017 | Lee | ........................ G09G 3/3266 |
| 2018/0204895 A1* | 7/2018 | Lin | ........................ G09G 3/006 |

(Continued)

FOREIGN PATENT DOCUMENTS

| CN | 109473071 A | 3/2019 |
| CN | 110136635 A | 8/2019 |
| KR | 1020190005609 A | 1/2019 |

*Primary Examiner* — Evren Seven
(74) *Attorney, Agent, or Firm* — The Webb Law Firm

(57) ABSTRACT

Provided are an array substrate and a display device. The array substrate includes: a base substrate including a display area and a peripheral area including a first peripheral area; plurality of sub-pixels and data lines; a plurality of control signal lines, data signal input lines and a multiplexing circuit. At least one multiplexing unit includes a plurality of switching transistors, at least one of which including: a first active layer, a first gate including a first gate portion and a second gate portion spaced apart and electrically connected to a control signal line; two first electrodes electrically connected to the first active layer and a data signal input line; and a second electrode electrically connected to the first active layer and one of at least two data lines, an orthographic projection of the second electrode on the base substrate being located between that of the two first electrodes.

20 Claims, 12 Drawing Sheets

(56) References Cited

U.S. PATENT DOCUMENTS

2019/0079330 A1    3/2019   Yamamoto et al.
2019/0088208 A1    3/2019   Chang et al.
2019/0181211 A1*   6/2019   Bae ..................... H10K 59/131
2021/0358360 A1*   11/2021  Wang ...................... G09G 3/20

* cited by examiner

ARRAY SUBSTRATE AND DISPLAY DEVICE

CROSS-REFERENCE TO RELATED APPLICATIONS

The present application is a U.S. National Stage Application under 35 U.S.C. § 371 of International Patent Application No. PCT/CN2020/089069, filed on May 7, 2020, the disclosure of which is incorporated by reference herein in its entirety.

TECHNICAL FIELD

The present disclosure relates to an array substrate and a display device.

BACKGROUND

In recent years, due to the characteristics such as self-luminescence, wide viewing angle, short response time, high luminous efficiency, wide color gamut, low operating voltage, large-scale production, flexibility, and simple manufacturing process, the OLED (organic light emitting diode) display panels are widely applied.

SUMMARY

According to one aspect of the embodiments of the present disclosure, provided is an array substrate, comprising: a base substrate comprising a display area and a peripheral area surrounding the display area, wherein the peripheral area comprises a first peripheral area located on one side of the display area; a plurality of sub-pixels located at the display area; a plurality of data lines located at the display area, electrically connected to the plurality of sub-pixels, and configured to provide a data signal to the plurality of sub-pixels; a plurality of control signal lines located at least at the first peripheral area; a plurality of data signal input lines located at least at the first peripheral area; and a multiplexing circuit located at least at the first peripheral area, located on one side of the plurality of control signal lines close to the display area, and comprising a plurality of multiplexing units, wherein at least one of the plurality of multiplexing units is electrically connected to the plurality of control signal lines, a data signal input line of the plurality of data signal input lines, and at least two data lines of the plurality of data lines, and comprises a plurality of switch transistors, wherein at least one of the plurality of switch transistors comprises: a first active layer located on one side of the base substrate, a first gate located on one side of the first active layer away from the base substrate, and comprising a first gate portion and a second gate portion that are spaced apart and electrically connected to a control signal line of the plurality of control signal lines, two first electrodes located on one side of the first gate away from the base substrate and electrically connected to the first active layer and the data signal input line, and a second electrode located on one side of the first gate away from the base substrate and electrically connected to the first active layer and one of the at least two data lines, wherein an orthographic projection of the second electrode on the base substrate is located between orthographic projections of the two first electrodes on the base substrate.

In some embodiments, the plurality of switch transistors comprises two switch transistors which share one of the two first electrodes.

In some embodiments, the at least one switch transistor further comprises at least one of an electrode connecting portion or a gate connecting portion, wherein: an orthographic projection of the electrode connecting portion on the base substrate is located between an orthographic projection of the first active layer on the base substrate and orthographic projections of the plurality of control signal lines on the base substrate, and the two first electrodes are electrically connected to the data signal input line through the electrode connecting portion, and an orthographic projection of the gate connecting portion on the base substrate is located between the orthographic projection of the first active layer on the base substrate and the orthographic projection of the electrode connecting portion on the base substrate, and the first gate portion and the second gate portion are electrically connected to the control signal line through the gate connecting portion.

In some embodiments, the two first electrodes and the electrode connecting portion are integrally provided, and the first gate portion, the second gate portion and the gate connecting portion are integrally provided.

In some embodiments, an orthographic projection of the first gate portion on the base substrate is located between an orthographic projection of one of the two first electrodes on the base substrate and an orthographic projection of the second electrode on the base substrate; and an orthographic projection of the second gate portion on the base substrate is located between an orthographic projection of the other of the two first electrodes on the base substrate and the orthographic projection of the second electrode on the base substrate.

In some embodiments, the first active layer comprises: a first active portion; and a second active portion located between the first active portion and the display area, wherein each of the two first electrodes and the second electrode are electrically connected to the first active portion through a plurality of first vias respectively, and each of the two first electrodes and the second electrode are electrically connected to the second active portion through a plurality of second vias respectively.

In some embodiments, the two first electrodes and the second electrode extend along a first direction, and the plurality of first vias and the plurality of second vias are arranged along the first direction.

In some embodiments, the array substrate further comprises: a plurality of power lines located at the display area, electrically connected to the plurality of sub-pixels, and configured to provide a first power signal to the plurality of sub-pixels; and a first power bus located at least at the first peripheral area and electrically connected to the plurality of power lines, wherein an orthographic projection of a portion of the first power bus located at the first peripheral area on the base substrate is located on one side of an orthographic projections of the plurality of control signal lines on the base substrate away from the display area.

In some embodiments, the plurality of multiplexing units comprises a plurality of first multiplexing units located at the first peripheral area, and the array substrate further comprises: a plurality of power bus connectors located at the first peripheral area, wherein an orthographic projection of at least one of the plurality of power bus connectors on the base substrate is located between orthographic projections of two adjacent first multiplexing units of the plurality of first multiplexing units on the base substrate, and the at least one of the plurality of power bus connectors comprises a first connecting layer and a second connection which are located in different layers; and a second power bus located at least at the first peripheral area, located between the multiplexing circuit and the display area, and electrically connected to the first power bus through the plurality of power bus connectors.

In some embodiments, an orthographic projection of the first connecting layer on the base substrate at least partially overlaps with an orthographic projection of the second connecting layer on the base substrate.

In some embodiments, at least one of the plurality of sub-pixels comprises: a driving transistor, comprising: a second active layer located on the base substrate, a second gate located on one side of the second active layer away from the base substrate, a first insulating layer located on one side of the second gate away from the base substrate, a second insulating layer located on one side of the first insulating layer away from the base substrate, and a source and a drain which are located on one side of the second insulating layer away from the base substrate and electrically connected to the second active layer; and a storage capacitor, comprising: a first electrode plate located in a same layer as the second gate, and a second electrode plate located between the first insulating layer and the second insulating layer, wherein the second active layer and the first active layer are located in a same layer, the second gate and the first gate are located in a same layer, and the source, the drain, the two first electrodes and the second electrode are located in a same layer.

In some embodiments, the peripheral area further comprises a corner area adjacent to the first peripheral area, the first power bus is also located at the corner area, and the first power bus and the plurality of data signal input lines are located on different layers, and the array substrate further comprises: a plurality of control signal connecting lines located in a different layer from the plurality of data signal input lines and located between the first power bus and the display area, wherein each of the plurality of control signal connecting lines is electrically connected to one of the plurality of control signal lines; and a plurality of control signal input lines located in a different layer from the first power bus, wherein each of the plurality of control signal input lines is electrically connected to a control signal connecting line of the control signal connecting lines via a third via, and an orthographic projection of the third via on the base substrate is located between an orthographic projection of a portion of the first power bus line located at the corner area on the base substrate and orthographic projections of the plurality of data signal input lines on the base substrate.

In some embodiments, orthographic projections of the plurality of control signal input lines on the base substrate pass through an orthographic projection of the first power bus on the base substrate; and each of the plurality of control signal connecting lines comprises a first control signal connecting portion located in a same layer as the first power bus, and electrically connected to one of the plurality of control signal input lines through the third via, wherein an orthographic projection of the first control signal connecting portion on the base substrate passes through the orthographic projections of the plurality of data signal input lines on the base substrate.

In some embodiments, at least one of the plurality of sub-pixels comprises: a driving transistor, comprising: a second active layer located on the base substrate, a second gate located on one side of the second active layer away from the base substrate, a first insulating layer located on one side of the second gate away from the base substrate, a second insulating layer located on one side of the first insulating layer away from the base substrate, and a source and a drain which are located on one side of the second insulating layer away from the base substrate and electrically connected to the second active layer; and a storage capacitor, comprising: a first electrode plate located in a same layer as the second gate, and a second electrode plate located between the first insulating layer and the second insulating layer, wherein the plurality of control signal input lines and the plurality of data signal input lines are located in a same layer as at least one of the first electrode plate or the second electrode plate, and the first power bus, the source and the drain are located in a same layer.

In some embodiments, each of the plurality of control signal connecting lines further comprises: a second control signal connecting portion located in a different layer from the first control signal connecting portion, electrically connected to the first control signal connecting portion through a fourth via, and electrically connected to the one of the plurality of control signal lines, wherein an orthographic projection of the fourth via on the base substrate is located between the orthographic projections of the plurality of control signal lines on the base substrate and the orthographic projections of the plurality of data signal input lines on the base substrate.

In some embodiments, the plurality of multiplexing units comprises a plurality of first multiplexing units located at the first peripheral area and a plurality of second multiplexing units located at the corner area, wherein the data signal input line electrically connected to one of the plurality of first multiplexing units which is closest to the corner area is a first data signal input line, and the data signal input line electrically connected to one of the plurality of second multiplexing units which is closest to the first peripheral area is a second data signal input line; a portion of an orthographic projection of the one of the plurality of control signal lines on the base substrate, which is located between an orthographic projection of the first data signal input line on the base substrate and an orthographic projection of the second data signal input line on the base substrate, is a first projection; and the second signal connecting portion is electrically connected to the one of the plurality of control signal lines through a fifth via, wherein an orthographic projection of the third via on the base substrate overlaps with the first projection.

In some embodiments, the multiplexing circuit further comprises: a dummy multiplexing unit located between the plurality of first multiplexing units and the plurality of second multiplexing units.

In some embodiments, the array substrate further comprises: a plurality of gate lines located at the display area, electrically connected to the plurality of sub-pixels, and configured to provide a gate signal to the plurality of sub-pixels; a plurality of light emitting control lines located at the display area, electrically connected to the plurality of sub-pixels, and configured to provide a light emitting control signal to the plurality of sub-pixels; a plurality of groups of connecting lines located at least at the corner area, wherein each group of connecting lines of the plurality of groups of connecting lines comprises a plurality of connecting lines comprising: a gate connecting line electrically connected to one of the plurality of gate lines, and a light emitting control connecting line electrically connected to one of the plurality of light emitting control lines; a gate driving circuit located at least at the corner area and comprising a plurality of gate driving units connected to the plurality of gate lines through the gate connecting line in the plurality of groups of connecting lines; a light emitting control driving circuit located at least at the corner area, located on one side of the gate driving circuit away from the display area, and comprising a plurality of light emitting control driving units electrically connected to the plurality of light emitting control lines through the light emitting control connecting line in the plurality of groups of connecting lines, wherein an orthographic projection of each of the plurality of connecting lines on the base substrate passes between orthographic projections of two adjacent multiplexing units of the plurality of multiplexing units on the base substrate, and does not overlap with orthographic projections of the plurality of multiplexing units on the base substrate.

In some embodiments, the plurality of connecting lines further comprise a power connecting line, and the array substrate further comprises: a plurality of power lines located at the display area, electrically connected to the plurality of sub-pixels, and configured to provide a first power signal to the plurality of sub-pixels; and a first power bus located at the first peripheral area and the corner area, located between the gate driving circuit and the multiplexing circuit, and electrically connected to the plurality of power lines through the power connecting line in the plurality of groups of connecting lines.

In some embodiments, the plurality of connecting lines further comprise an initialization connecting line, and the array substrate further comprises: a plurality of initialization lines located at the display area, electrically connected to the plurality of sub-pixels, and configured to provide an initialization signal to the plurality of sub-pixels; and an initialization bus located at least at the corner area, located between the gate driving circuit and the first power bus, and electrically connected to the plurality of initialization lines through the initialization connecting line in the plurality of groups of connecting lines.

In some embodiments, at least one of the plurality of sub-pixels comprises: a driving transistor, comprising: a second active layer located on the base substrate, a second gate located on one side of the second active layer away from the base substrate, a first insulating layer located on one side of the second gate away from the base substrate, a second insulating layer located on one side of the first insulating layer away from the base substrate, and a source and a drain which are located on one side of the second insulating layer away from the base substrate and electrically connected to the second active layer; and a storage capacitor, comprising: a first electrode plate located in a same layer as the first gate, and a second electrode plate located between the first insulating layer and the second insulating layer, wherein each of the plurality of connecting lines comprises a first connecting portion, an orthographic projection of the first connecting portion on the base substrate passes between the orthographic projections of the two adjacent multiplexing units on the base substrate, and at least one of the first connecting portion of the gate connecting line, the first connecting portion of the light emitting control connecting line, the first connecting portion of the power connecting line, or the first connecting portion of the initialization connecting line is located in a same layer as one of the first electrode plate and the second electrode plate.

In some embodiments, the first connecting portion of the light emitting control connecting line is located in a same layer as the first electrode plate; the first connecting portion of the gate connecting line and the first connecting portion of the initialization connecting line are located in a same layer as the second electrode plate; and the first connecting portion of the power connecting line is located in a same layer as at least one of the first electrode plate or the second electrode plate.

In some embodiments, each of the plurality of connecting lines further comprises a second connecting portion electrically connected to the first connecting portion, and located in a same layer as the source and the drain, wherein an orthographic projection of the second connecting portion on the base substrate passes through the orthographic projections of the plurality of data signal input lines on the base substrate.

In some embodiments, each of the gate connecting line, the light emitting control connecting line, and the initialization connecting line further comprises a third connecting portion electrically connected to the second connecting portion, and located on one side of the second connecting portion away from the first connecting portion, wherein an orthographic projection of the third connecting portion on the base substrate passes through an orthographic projection of the first power bus on the base substrate; and at least one of the third connecting portion of the gate connecting line, the third connecting portion of the light emitting control connecting line, or the third connecting portion of the initialization connecting line is located in a same layer as one of the first electrode plate and the second electrode plate.

In some embodiments, the third connecting portion of the light emitting control connecting line is located in a same layer as the first electrode plate; and the third connecting portion of the gate connecting line, and the third connecting portion of the initialization connecting line are located in a same layer as the second electrode plate.

In some embodiments, one of two adjacent data signal input lines electrically connected to two adjacent multiplexing units of the plurality of multiplexing units is located in a same layer as the first electrode plate, and the other of the two adjacent data signal input lines is located in a same layer as the second electrode plate.

According to another aspect of the embodiments of the present disclosure, provided is a display device, comprising the array substrate according to any one of the above embodiments.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
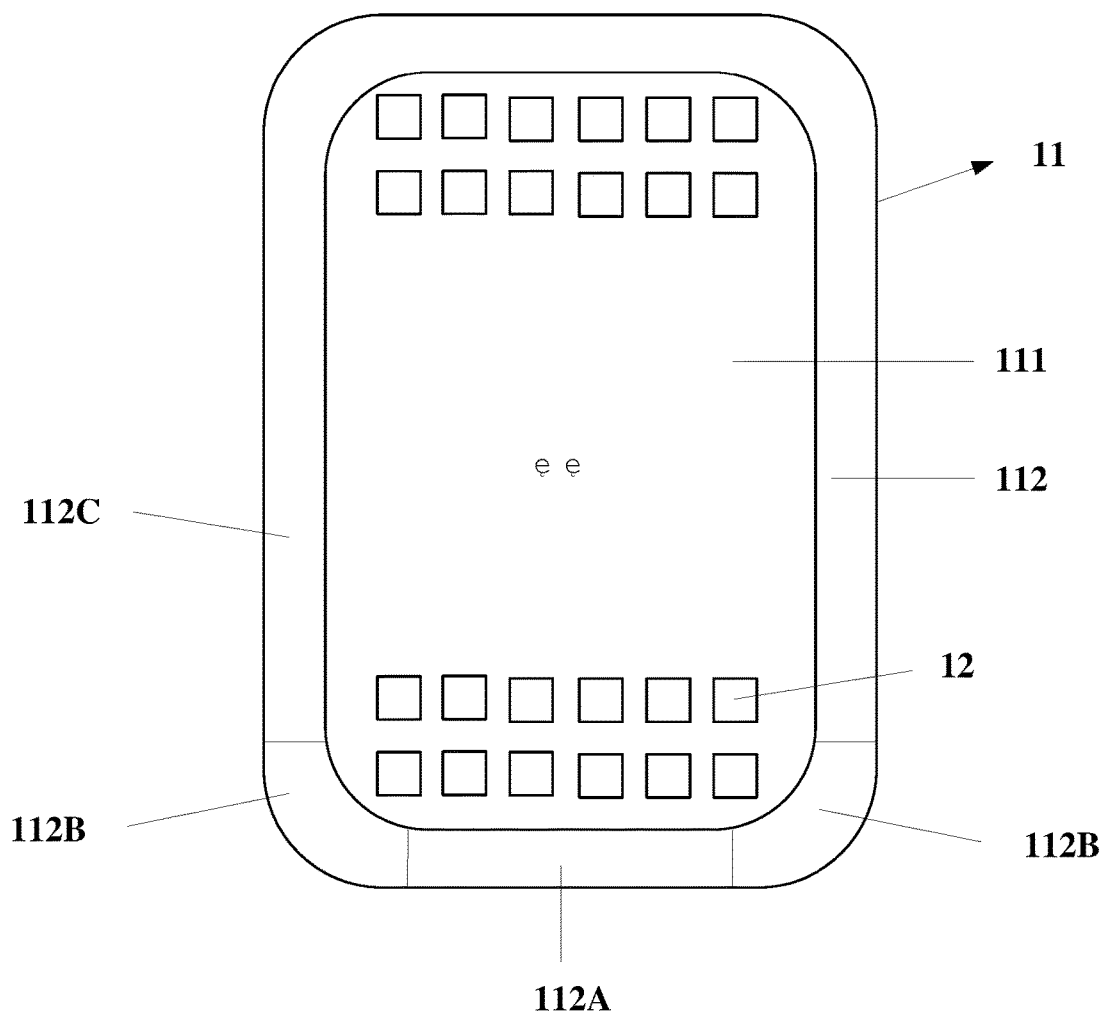
FIG. 1A is a schematic structure view showing an array substrate according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, with a multiplexing circuit, data signals can be input to two or more than two data lines by using one data signal input line sub-pixels. In this manner, the number of signal lines connecting the array substrate and an integrated circuit can be lessened, so that the size of the integrated circuit can be reduced, which helps to reduce the frame size of the array substrate, and may reduce the process complexity and cost.

The inventor has noticed that the wirings of the multiplexing circuit located at the corner area of the array substrate and the wirings of other circuits are likely to be affected by each other. In view of the above, the embodiments of the present disclosure provide the following technical solutions.

Figure 1B:
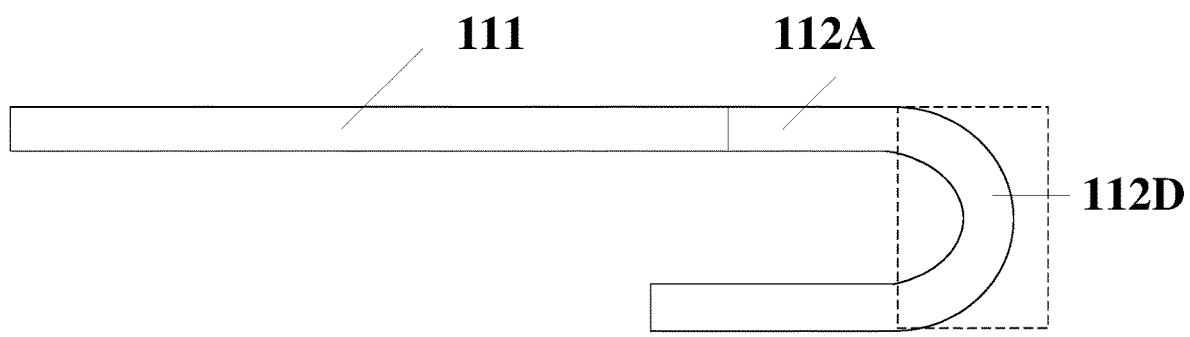
FIG. 1B is a schematic view showing the structure of a base substrate according to an embodiment of the present disclosure.

FIG. 1A is a schematic structure view showing an array substrate according to an embodiment of the present disclosure. FIG. 1B is a schematic view showing the structure of a base substrate according to an embodiment of the present disclosure.

As shown in FIG. 1A, the array substrate comprises a base substrate 11 and a plurality of sub-pixels 12.

The base substrate 11 comprises a display area 111 and a peripheral area 112 surrounding the display area. The peripheral area 112 comprises a first peripheral area 112A located on one side of the display area 111. The peripheral area 112 may also comprise a corner area 112B adjacent to the first peripheral area 112A. Here, FIG. 1A shows a corner area 112B located on one side of the first peripheral area 112A and a corner area 112B located on the other side of the first peripheral area 112A.

In some embodiments, the first peripheral area 112A may be a straight-side area. In some embodiments, the corner area 112B may have be of a radian, such as in a shape of a circular arc. It should be understood that the peripheral area 112 also comprises other peripheral areas, such as a second peripheral area 112C adjacent to the corner area 112B. In some embodiments, referring to FIG. 1B, the peripheral area 112 may further comprise a bending area 112D located on one side of the first peripheral area 112A away from the display area 11. In some embodiments, the base substrate 11 may comprise a flexible substrate, such as a polyimide (PI) substrate or the like.

A plurality of sub-pixels 12 is located at the display area 111. For example, the plurality of sub-pixels 12 may comprise a red sub-pixel, a green sub-pixel, a blue sub-pixel, or the like. Each sub-pixel 12 comprises a pixel circuit. For example, the pixel circuit may comprise 6 transistors and 1 capacitor (6T1C); for another example, the pixel circuit may comprise 7 transistors and 1 capacitor (7T1C).

It should be noted that for the array substrates in different embodiments introduced below, the base substrate 11 and the plurality of sub-pixels 12 may refer to the above description and will not be introduced repeatedly in the following description.

Figure 2A:
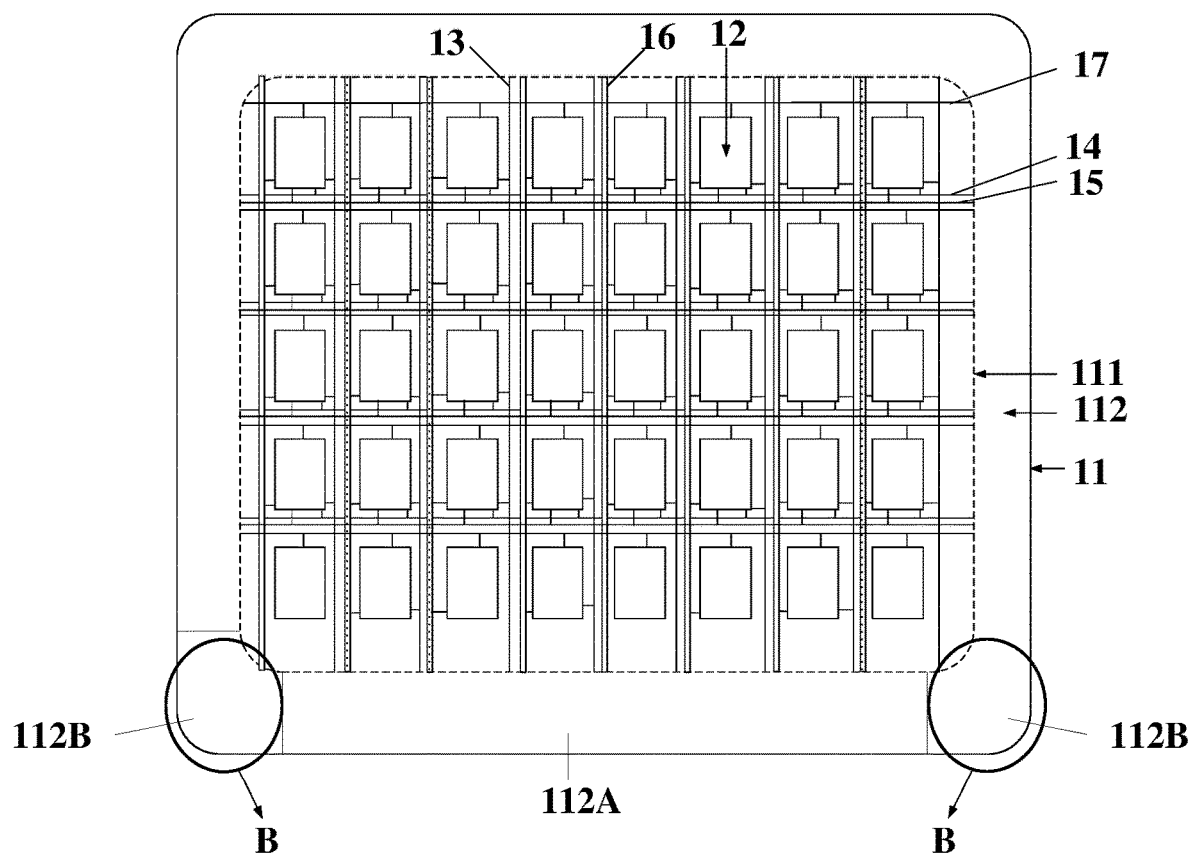
FIG. 2A is a schematic structure view showing an array substrate according to another embodiment of the present disclosure.
Figure 2B:
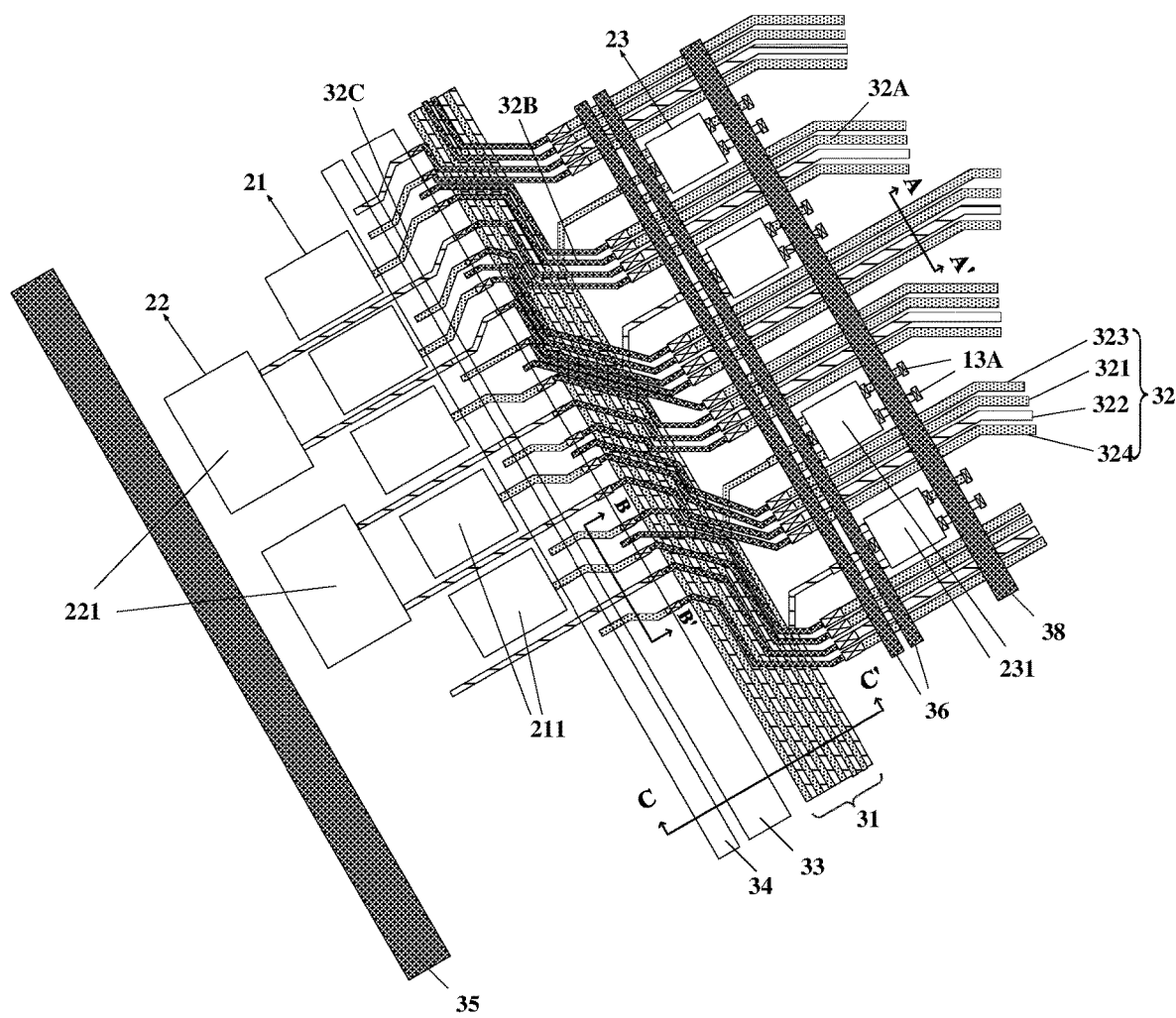
FIG. 2B is an enlarged schematic view showing a partial area in the circle B of the array substrate shown in FIG. 2A.

FIG. 2A is a schematic structure view showing an array substrate according to another embodiment of the present disclosure. FIG. 2B is an enlarged schematic view showing a partial area in the circle B of the array substrate shown in FIG. 2A. It should be understood that at least one of two circles B shown in FIG. 2A may comprise the structure shown in FIG. 2B.

As shown in FIGS. 2A and 2B, the array substrate comprises a base substrate 11, a plurality of sub-pixels 12, a plurality of data lines 13, a plurality of gate lines 14, a plurality of light emitting control lines 15, agate driving circuit 21, a light emitting control driving circuit 22, a multiplexing circuit 23, a plurality of data signal input lines 31 and a plurality of groups of connecting lines 32.

Referring to FIG. 2A, the base substrate 11 comprises a display area 111 and a peripheral area 112 surrounding the display area. The peripheral area 112 comprises a first peripheral area 112A located on one side of the display area 111 and a corner area 112B adjacent to the first peripheral area 112A.

The plurality of data lines 13 is located at the display area 111 and electrically connected to the plurality of sub-pixels 12 located at the display area 111. The plurality of data lines 13 is configured to provide a data signal to the plurality of sub-pixels 12. For example, each data line 13 is electrically connected to a column of sub-pixels 12.

The plurality of gate lines 14 are located at the display area 111 and electrically connected to the plurality of sub-pixels 12. The plurality of gate lines 14 is configured to provide a gate signal to the plurality of sub-pixels 12. For example, each gate line 14 is electrically connected to a row of sub-pixels 12.

The plurality of light emitting control lines 15 is located at the display area 111 and electrically connected to the plurality of sub-pixels 12. The plurality of light emitting control lines 15 is configured to provide a light emitting control signal to the plurality of sub-pixels 12. For example, each light emitting control line 15 is electrically connected to a row of sub-pixels 12.

Referring to FIG. 2B, a plurality of groups of connecting lines 32 is located at least at the corner area 112B. Each group of connecting lines 32 comprises a plurality of connecting lines which comprises at least a gate connecting line 321 and a light emitting control connecting line 322. The gate connecting line 321 is electrically connected to one gate line 14 of the plurality of gate lines 14. For example, the gate connecting line 321 is electrically connected to the gate line 14 of a row of sub-pixels 12 and a reset control line of an adjacent row of sub-pixels 12. The light emitting control connecting line 322 is electrically connected to at least one light emitting control line 15 of the plurality of light emitting control lines 15. For example, the light emitting control connecting line 322 is electrically connected to two adjacent light emitting control lines 15 which are electrically connected to two adjacent rows of sub-pixels.

The gate driving circuit 21 is located at least at the corner area 112B. For example, the gate driving circuit 21 may also be located at the second peripheral area 112C. The gate driving circuit 21 comprises a plurality of gate driving units 211, for example, a plurality of cascaded first shift registers. The plurality of gate driving units 211 is electrically connected to the plurality of gate lines 14 through the gate connecting lines 321 in the plurality of groups of connecting lines 32. For example, one gate driving unit 211of two adjacent gate driving units 211 located at the corner area 112B is electrically connected to one gate line 14 through a gate connecting line 321 in one group of connecting lines 32, and the other gate driving unit 211 is electrically connected to another gate line 14 through a gate connecting line 321 in another group of connecting lines 32.

The light emitting control driving circuit 22 is located at least at the corner area 112B and located on one side of the gate driving circuit 21 away from the display area 111. For example, the light emitting control driving circuit 22 may also be located at the second peripheral area 112C. The light emitting control driving circuit 22 comprises a plurality of light emitting control driving units 221, such as a plurality of cascaded second shift registers. The plurality of light emitting control driving units 221 is electrically connected to the plurality of light emitting control lines 15 through the light emitting control connecting lines 322 in the plurality of groups of connecting lines 32. For example, one light emitting control driving unit 211 of two adjacent light emitting control driving units 211 located at the corner area 112B is electrically connected to one light emitting control line 15 through alight emitting control connecting line 322 in one group of connecting lines 32, and the other light emitting control driving unit 211 is electrically connected to another light emitting control line 15 through alight emitting control connecting line 322 in another group of connecting lines 32.

The plurality of data signal input lines 31 and the multiplexing circuit 23 are located at least at the corner area 112B. For example, the plurality of data signal input lines 31 and the multiplexing circuit 23 may also be located at the first peripheral area 112A. The multiplexing circuit 23 is located on one side of the gate driving circuit 21 close to the display area 111 and comprises a plurality of multiplexing units 231. At least one multiplexing unit 231 is electrically connected to a data signal input line 31 of the plurality of data signal input lines 31 and at least two data lines 13 of the plurality of data lines 13.

For example, the multiplexing unit 231 may be connected to the data line 13 located at the display area 111 through the data line lead 13A. For example, each multiplexing unit 231 may comprise two switch transistors connected in parallel. When one switch transistor is turned on, the other switch transistor is turned off. In this way, the data signal may be provided to the data line through the switch transistor that is turned on.

In each group of connecting lines 32, the orthographic projection of each of the plurality of connecting lines (for example, the gate connecting line 321 and the light emitting control connecting line 322) on the base substrate 11 passes between the orthographic projections of two adjacent multiplexing units 231 of the plurality of multiplexing units 231 on the base substrate 11. The orthographic projection of each connecting line (for example, the gate connecting line 321 and the light emitting control connecting line 322) on the base substrate 11 does not overlap with the orthographic projections of the plurality of multiplexing units 231 on the base substrate 11.

In the above embodiments, the gate driving circuit 21 is electrically connected to the plurality of gate lines 14 located at the display area 111 through the gate connecting lines 321 of the plurality of connecting lines 32, and the light emitting control driving circuit 22 is electrically connected to the light emitting control lines 15 located at the display area 111 through the light emitting control connecting lines 322 in the plurality of groups of connecting lines 32. The gate connecting line 321 and the light emitting control connecting line 322 pass between two adjacent multiplexing units 231 and do not overlap with the orthographic projection of each multiplexing unit 231 on the base substrate 11. In this manner, the gate connecting line 321 and the multiplexing circuit 23, and the light emitting control connecting line 322 and the multiplexing circuit 23 are less affected by each other.

In some embodiments, referring to FIG. 2B, the plurality of connecting lines in each group of connecting lines 32 further comprise a power connecting line 323. Referring to FIGS. 2A and 2B, the array substrate further comprises a plurality of power lines 16 and a first power bus 33.

The plurality of power lines 16 is located at the display area 111, and electrically connected to the plurality of sub-pixels 12. The plurality of power lines 16 is configured to provide a first power signal to the plurality of sub-pixels 12. The first power bus line 33 is located at the first peripheral area 112A and the corner area 112B and located between the gate driving circuit 21 and the multiplexing circuit 23. The first power bus 33 is electrically connected to the plurality of power lines 16 located at the display area 111 through the power connecting lines 323 in the plurality of groups of connecting lines 32.

In the above embodiments, the power connecting line 323 passes between two adjacent multiplexing units 231 and does not overlap with the orthographic projection of each multiplexing unit 231 on the base substrate 11. In this manner, the power connecting line 323 and the multiplexing circuit 23 are less affected by each other.

In some embodiments, referring to FIG. 2B, the plurality of connecting lines in each group of connecting lines 32 further comprise an initialization connecting line 324. Referring to FIG. 1A, the array substrate further comprises a plurality of initialization lines 17 and an initialization bus 34.

The plurality of initialization lines 17 are located at the display area 111, and electrically connected to the plurality of sub-pixels 12. The plurality of initialization lines 17 is configured to provide an initialization signal to the plurality of sub-pixels 12. The initialization bus 34 is located at least at the corner area 112B and located between the gate driving circuit 21 and the first power bus 33. The initialization bus 34 is electrically connected to the plurality of initialization lines 17 located at the display area 111 through the initialization connecting lines 324 in the plurality of groups of connecting lines 32.

In the above embodiments, the initialization connecting line 324 passes between two adjacent multiplexing units 231 and does not overlap with the orthographic projection of each multiplexing unit 231 on the base substrate 11. In this manner, the initialization connecting line 324 and the multiplexing circuit 23 are less affected by each other.

In some embodiments, one group of connecting lines 32 may be provided between two adjacent multiplexing units 231. In other embodiments, more than one group of connecting lines 32 may be provided between two adjacent multiplexing units 231. In still other embodiments, one group of connecting lines 32 may be provided between two adjacent multiplexing units 231, and more than one group of connecting lines 32 may be provided between another two adjacent multiplexing units 231.

Figure 3:
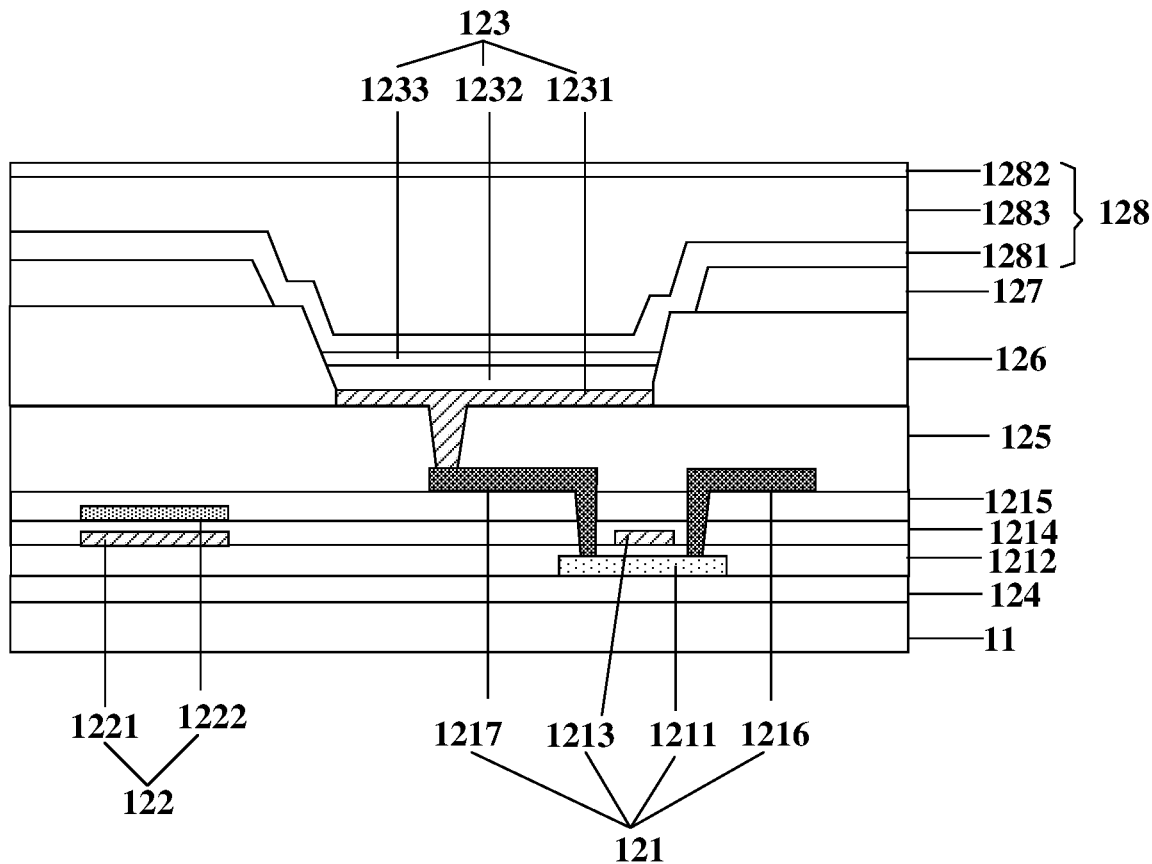
FIG. 3 is a schematic cross-sectional view showing a sub-pixel according to an embodiment of the present disclosure.

FIG. 3 is a schematic cross-sectional view showing a sub-pixel according to an embodiment of the present disclosure. At least one sub-pixel 12 of the plurality of sub-pixels 12 may comprise the structure shown in FIG. 3.

As shown in FIG. 3, the sub-pixel 12 comprises a driving transistor 121 and a storage capacitor 122. The driving transistor 121 comprises a first active layer 1211 located on the base substrate 11, a first gate 1213 located on one side of the first active layer 1211 away from the base substrate 11, a first insulating layer 1214 located on one side of the first gate 1213 away from the base substrate 11, a second insulating layer 1215 located on one side of the first insulating layer 1214 away from the base substrate 11, and a source 1216 and a drain 1217 which are located on one side of the second insulating layer 1215 away from the base substrate 11 and electrically connected to the first active layer 1211. In some embodiments, the driving transistor 121 further comprises a gate dielectric layer 1212 located on one side of the first active layer 1211 away from the base substrate 11, and the first gate 1213 is located on one side of the gate dielectric layer 1212 away from the base substrate 11. For example, the source 1216 and the drain 1217 are electrically connected to the first active layer 1211 through a via penetrating the second insulating layer 1215, the first insulating layer 1214, and the gate dielectric layer 1212 respectively.

The storage capacitor 122 comprises a first electrode plate 1221 located in a same layer as the first gate 1213, and a second electrode plate 1222 located between the first insulating layer 1214 and the second insulating layer 1215. It should be understood that the storage capacitor 122 further comprises a first insulating layer 1214 located between the first electrode plate 1221 and the second electrode plate 1222.

It should be noted that in the embodiments of the present disclosure, the expression that a plurality of components is located in a same layer means that the plurality of components is formed by patterning a same material layer.

The sub-pixel 12 also comprises a light emitting diode 123, for example, an OLED. The light emitting diode 123 comprises a first electrode 1231 (such as an anode), a functional layer 1232 located on one side of the first electrode 1231 away from the base substrate 11, and a second electrode 1233 (such as a cathode) located on one side of the functional layer 1232 away from the base substrate 11. For example, the first electrode 1231 of the light emitting diode 123 is electrically connected to the drain 1217 of the driving transistor 121. Here, the functional layer 1232 comprises at least a light emitting layer, such as an organic light emitting layer. In some embodiments, the functional layer 1232 may further comprise one or more of an electron transport layer, an electron injection layer, a hole transport layer, and a hole injection layer.

In some embodiments, referring to FIG. 3, the sub-pixel 12 may further comprise a buffer layer 124 located between the base substrate 11 and the first active layer 1211, a planarization layer 125 covering the source 1216 and the drain 1217, a pixel defining layer 126 for defining a plurality of sub-pixels 12, a support layer 127, and an encapsulation layer 128. For example, the first electrode 1231 of the light emitting diode 123 may be electrically connected to the drain 1217 of the driving transistor 121 through a via penetrating the planarization layer 125. For example, the pixel defining layer 126 defines a plurality of openings corresponding to the plurality of sub-pixels 12, and the light emitting diodes 123 of the plurality of sub-pixels 12 are located at the plurality of openings. For example, the encapsulation layer 128 may comprise a thin film encapsulation layer. In some embodiments, the encapsulation layer 128 may comprise a first inorganic layer 1281, a second inorganic layer 1282, and an organic layer 1283 located between the first inorganic layer 1281 and the second inorganic layer 1282.

As some implementations, one or more of the second insulating layer 1215, the first insulating layer 1214, the gate dielectric layer 1212, the buffer layer 124, the planarization layer 125, the pixel defining layer 126, and the support layer 127 may comprise organic insulating materials such as polyimide or resin materials, or inorganic insulating materials comprising silicon oxide, silicon nitride, or silicon oxynitride.

In some embodiments, the pixel circuit in the sub-pixel comprises 7 transistors and 1 capacitor. For example, other than the driving transistor 121, the sub-pixel 12 also comprises a first switch transistor, a second switch transistor, and a third switch transistor. The first electrode of the first switch transistor is electrically connected to one of the plurality of data lines, the second electrode of the first switch transistor is electrically connected to the first electrode (for example, the source) of the driving transistor 121, and the gate of the first switch transistor is electrically connected to one of the plurality of gate lines 14. The first electrode of the second switch transistor is electrically connected to one of the plurality of power lines 16, the second electrode of the second switch transistor is electrically connected to the first electrode (for example, the source 1216) of the driving transistor 122, and the gate of the second switch transistor is electrically connected to one of the plurality of light emitting control lines 15. The first electrode of the third switch transistor is electrically connected to the second electrode (for example, the drain 1217) of the driving transistor, the second electrode of the third switch transistor is electrically connected to the first electrode 1231 (for example, the anode) of the light emitting diode 123, and the gate of the third switch transistor is electrically connected to one of the light emitting control lines 15 of the gate line.

In some embodiments, referring to FIG. 2B, each of the plurality of connecting lines in each group of connecting lines 32 comprises a first connecting portion 32A. For example, each of the gate connecting line 321, the light emitting control connecting line 322, the power connecting line 323, and the initialization connecting line 324 comprises the first connecting portion 32A. The orthographic projection of the first connecting portion 32A on the base substrate 11 passes between the orthographic projections of the two adjacent multiplexing units 231 on the base substrate 11.

At least one of the first connecting portion 32A of the gate connecting line 321, the first connecting portion 32A of the light emitting control connecting line 322, the first connecting portion 32A of the power connecting line 323, and the first connecting portion 32A of the initialization connecting line 324 is located in a same layer as one of the first electrode plate 1221 and the second electrode plate 1222. In this manner, the first connecting portion 32A of each connecting line is implemented without additionally adding a metal layer, which reduces the process complexity and cost.

Figure 4A:
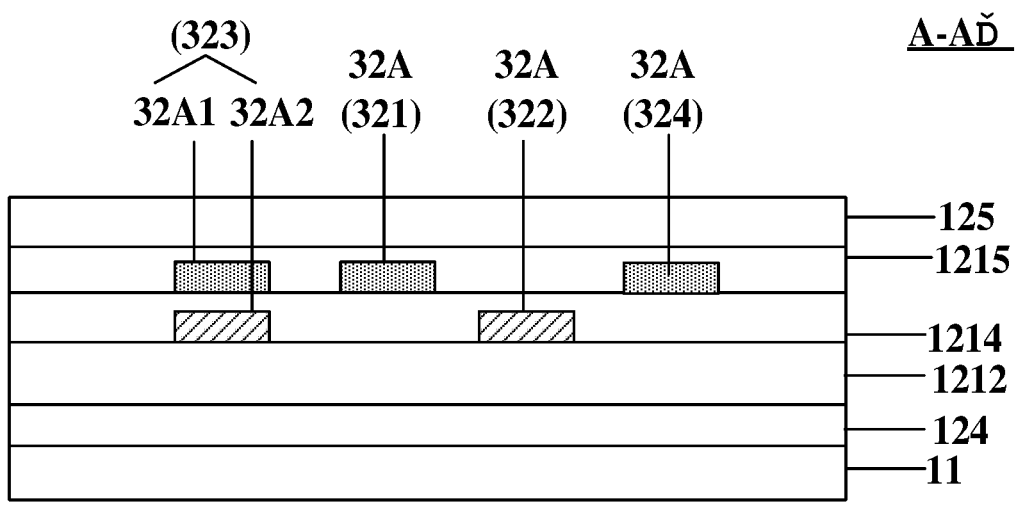
FIG. 4A is a schematic cross-sectional view taken along A-A' shown in FIG. 2B.

FIG. 4A is a schematic cross-sectional view taken along A-A' shown in FIG. 2B.

As shown in FIG. 4A, in some embodiments, the first connecting portion 32A of the light emitting control connecting line 322 and the first electrode plate 1221 are located in a same layer, and the first connecting portion 32A of the gate connecting line 321 and the first connecting portion 32A of the initialization connecting line 324 are located in a same layer as the second electrode plate 1222. The first connecting portion 32A of the power connecting line 323 is located in a same layer as at least one of the first electrode plate 1221 or the second electrode plate 1222. For example, the first connecting portion 32A of the power connecting line 323 comprises a first connecting sub-portion 32A1 located in a same layer as the first electrode plate 1221 and a second connecting sub-portion 32A2 located in a same layer as the second electrode plate 1222.

In some embodiments, referring to FIG. 2B, each of the plurality of connecting lines in each group of connecting lines 32 further comprises a second connecting portion 32B electrically connected to the first connecting portion 32A. For example, the second connecting portion 32B is located in a same layer as the source 1216 and the drain 1217. The orthographic projection of the second connecting portion 32B on the base substrate 11 passes through the orthographic projections of the plurality of data signal input lines 31 on the base substrate 11. Here, one end of the second connecting portion 32B of the power connecting line 323 is electrically connected to the first connecting portion 32A, and the other end is electrically connected to the first power bus 33. In this manner, the second connecting portion 32B of each connecting line is implemented without additionally adding a metal layer, which reduces the process complexity and cost.

In some embodiments, referring to FIG. 2B, each of the gate connecting line 321, the light emitting control connecting line 322, and the initialization connecting line 324 in each group of connecting lines 32 further comprises a third connecting portion 32C electrically connected to the second connecting portion 32B. The third connecting portion 32C is located on one side of the second connecting portion 32B away from the first connecting portion 32A. The orthographic projection of the third connecting portion 32C on the base substrate 11 passes through the orthographic projection of the first power bus on the base substrate 11. Here, at least one of the third connecting portion 32C of the gate connecting line 321, the third connecting portion 32C of the light emitting control connecting line 322, and the third connecting portion 32C of the initialization connecting line 324 is located in a same layer as one of the first electrode plate 1221 and the second electrode plate 1222. In this manner, the third connecting portion 32C of each connecting line is implemented without additionally adding a metal layer, which reduces the process complexity and cost.

Figure 4B:
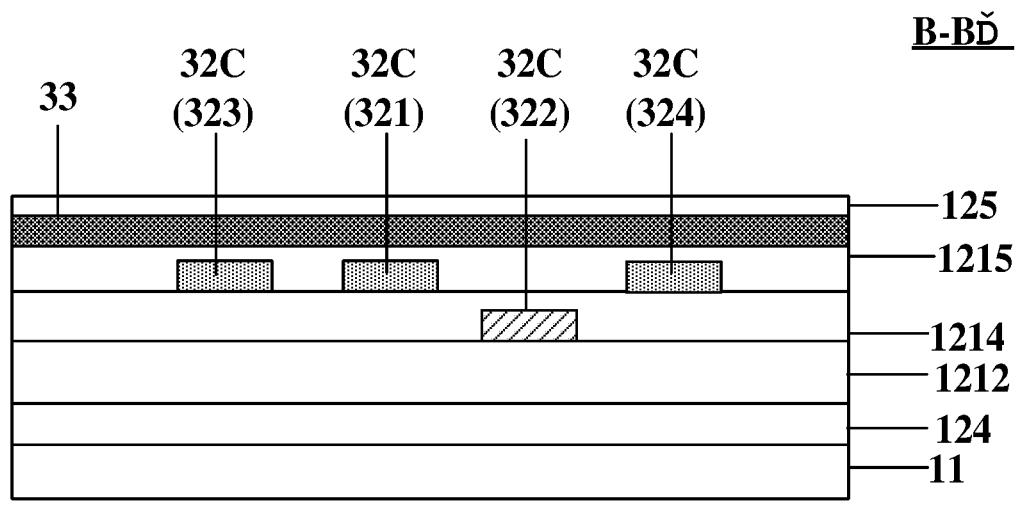
FIG. 4B is a schematic cross-sectional view taken along B-B' shown in FIG. 2B.

FIG. 4B is a schematic cross-sectional view taken along B-B' shown in FIG. 2B.

As shown in FIG. 4B, in some embodiments, the third connecting portion 32C of the light emitting control connecting line 322 is located in a same layer as the first electrode plate 1221, and the third connecting portion 32C of the gate connecting line 321 and the third connecting portion 32C of the initialization connecting line 323 are located in a same layer as the second electrode plate 1222.

Figure 4C:
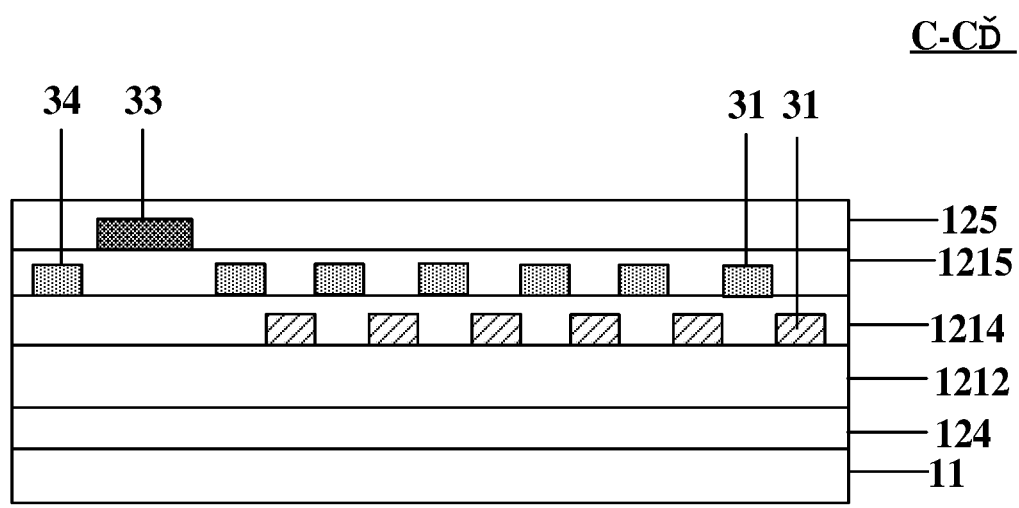
FIG. 4C is a schematic cross-sectional view taken along C-C' shown in FIG. 2B.

FIG. 4C is a schematic cross-sectional view taken along C-C' shown in FIG. 2B.

As shown in FIG. 4C, in some embodiments, at least one of the source 1216 or the drain 1217 is located in a same layer as the first power bus 33. In some embodiments, one of two adjacent data line input lines 31 of the plurality of data line input lines 31 is located in a same layer as the first electrode plate 1221, and the other is located in a same layer as the second electrode plate 1222. In some embodiments, at least one of the source 1216 or the drain 1217 is located in a same layer as the initialization bus 34.

In some embodiments, referring to FIG. 2B, the array substrate further comprises a third power bus 35 which is located on one side of the light emitting control driving circuit 22 away from the display area 111. The first power bus 33 is configured to provide a first power signal, and the third power bus 35 is configured to provide a second power signal. Here, the voltage of the second power signal is smaller than the voltage of the first power signal. For example, the second electrode 1233 of the light emitting diode 123 of each sub-pixel 12 in the plurality of sub-pixels 12 is electrically connected to the third power bus 35. In some embodiments, the third power bus 35 and the first power bus 33 are located in a same layer. For example, the third power bus 35, the first power bus 33, and the source 1216 and the drain 1217 of the driving transistor 121 in the sub-pixel 12 are located in a same layer.

The inventor has also noticed that in the related art, the multiplexing unit in the multiplexing circuit has a larger length in a certain direction, which is not favorable for reducing the frame size of the array substrate. In view of the above, the embodiments of the present disclosure also provide the following technical solutions.

Figure 5A:
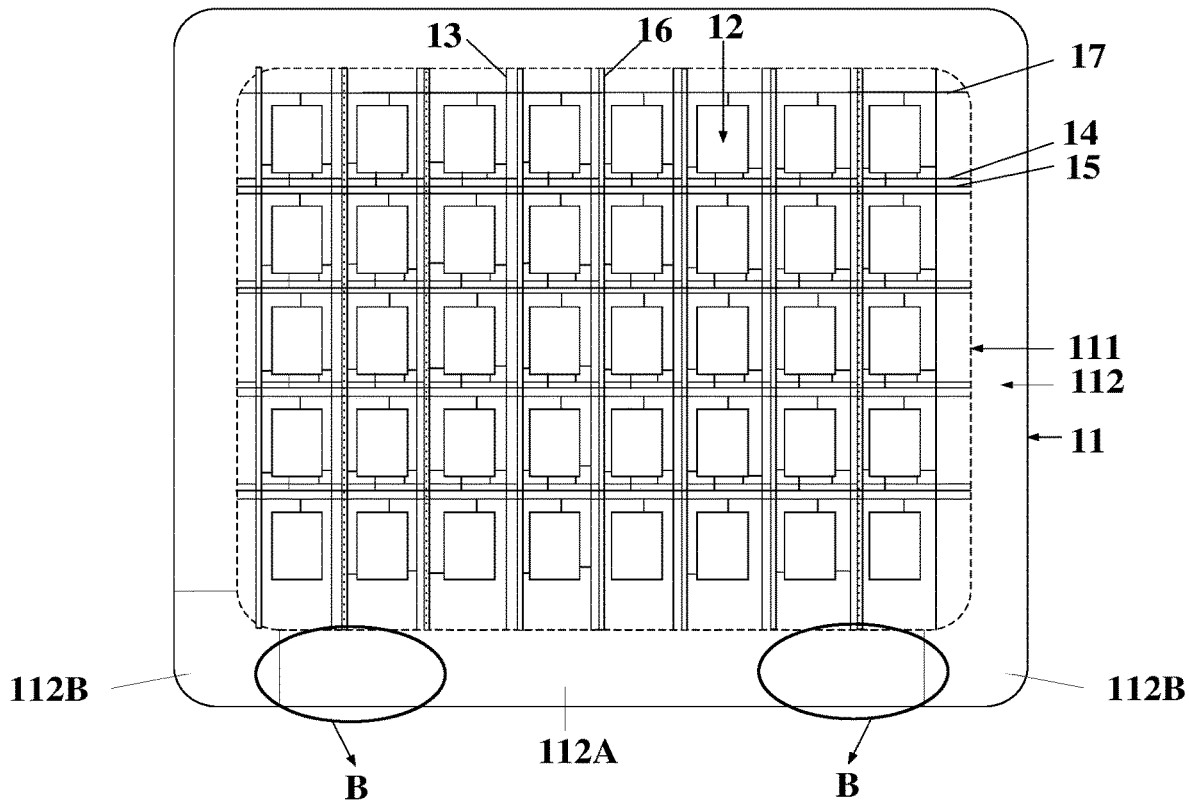
FIG. 5A is a schematic structure view showing an array substrate according to a further embodiment of the present disclosure.
Figure 5B:
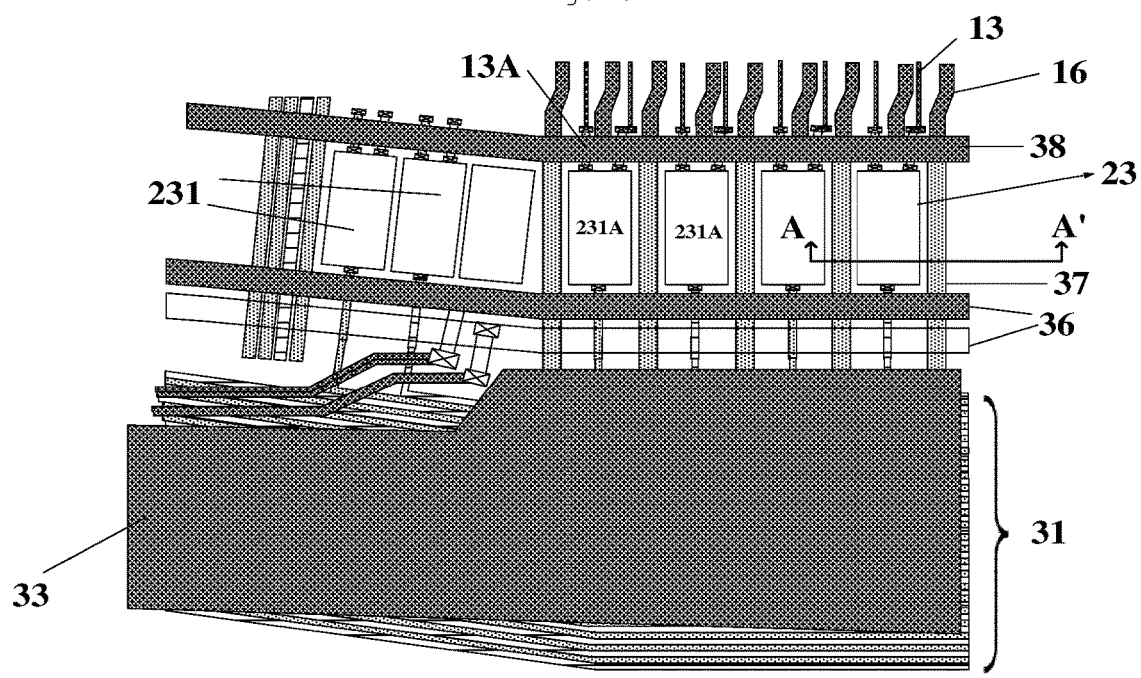
FIG. 5B is an enlarged schematic view showing a partial area in the circle B of the array substrate shown in FIG. 5A.

FIG. 5A is a schematic structure view showing an array substrate according to a further embodiment of the present disclosure. FIG. 5B is an enlarged schematic view showing a partial area comprised in the circle B in the array substrate shown in FIG. 5A. It should be understood that at least one of two circles B shown in FIG. 5A may comprise the structure shown in FIG. 5B.

As shown in FIGS. 5A and 5B, the array substrate comprises a base substrate 11, a plurality of sub-pixels 12, a plurality of data lines 13, a multiplexing circuit 23, a plurality of data signal input lines 31 and a plurality of control signal lines 36.

Referring to FIG. 5A, the base substrate 11 comprises a display area 111 and a peripheral area 112 surrounding the display area 111. The peripheral area 112 comprises a first peripheral area 112A located on one side of the display area 111. A plurality of sub-pixels 12 and a plurality of data lines 13 are located at the display area 111. Related description of the base substrate 11, the plurality of sub-pixels 12 and the plurality of data lines 13 may refer to the above, and thus will not be made in detail here.

The plurality of data signal input lines 31, the plurality of control signal lines 36, and the multiplexing circuit 23 are located at least at the first peripheral area 112A. For example, the plurality of data signal input lines 31, the plurality of control signal lines 36, and the multiplexing circuit 23 may also be located at the corner area 112B. The multiplexing circuit 23 is located on one side of the plurality of control signal lines 36 close to the display area 111 and comprises a plurality of multiplexing units 231. At least one multiplexing unit 231 is electrically connected to one data signal input line 31 of the plurality of data signal input lines 31 and at least two data lines 13 of the plurality of data lines 13. For example, the multiplexing unit 231 may be connected to the data line 13 through the data line lead 13A.

It should be understood that the multiplexing circuit 23 shown in FIG. 5B comprises a plurality of multiplexing units 231 located at the first peripheral area 112A and a plurality of multiplexing units 231 located at the corner area 112B.

Figure 6A:
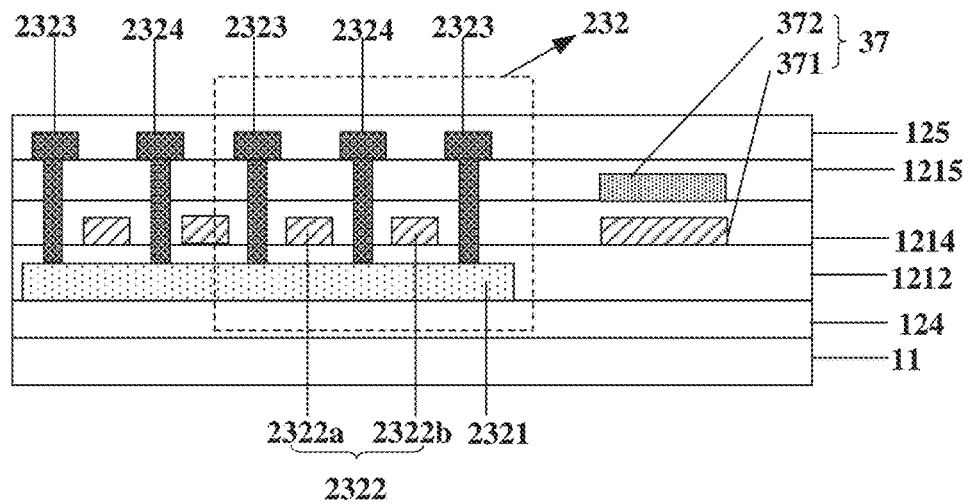
FIG. 6A is a schematic cross-sectional view taken along A-A' shown in FIG. 5B.
Figure 6B:
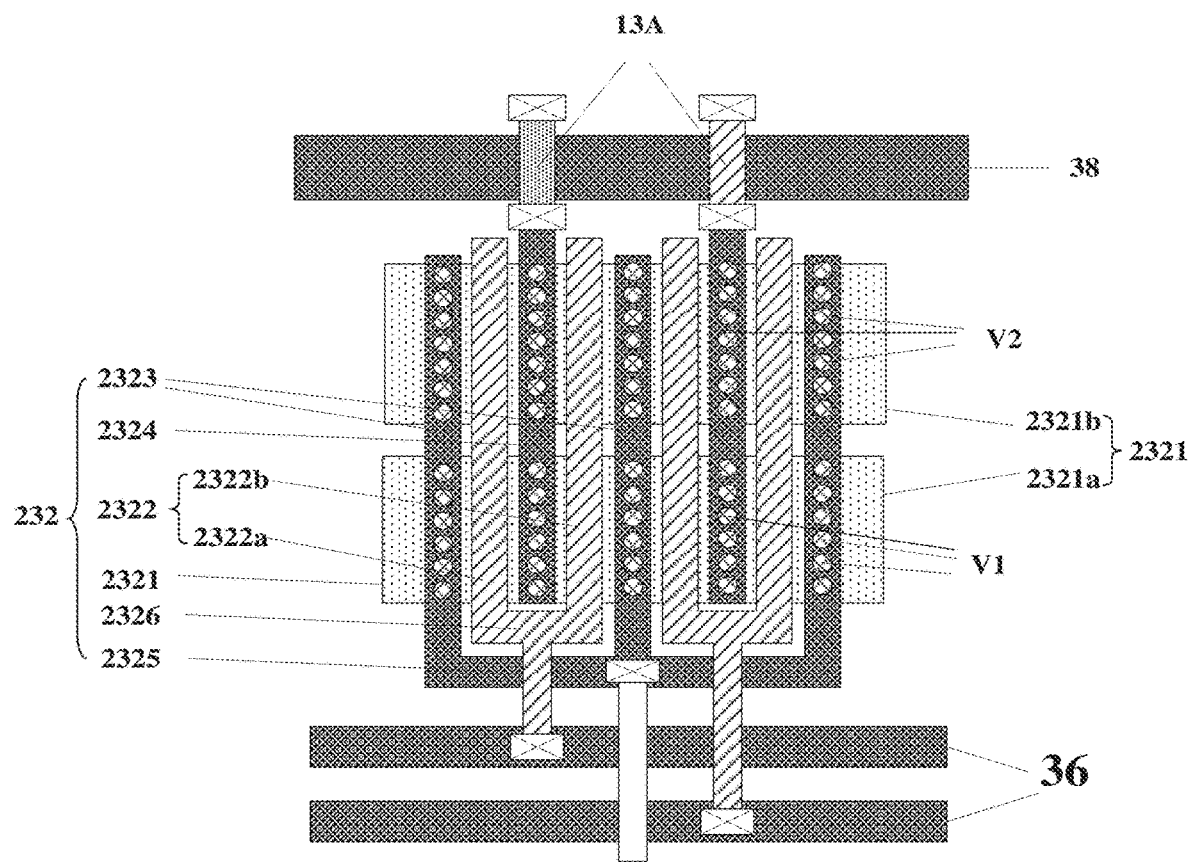
FIG. 6B is a schematic layout view showing a multiplexing unit according to an embodiment of the present disclosure.

FIG. 6A is a schematic cross-sectional view taken along A-A' shown in FIG. 5B. FIG. 6B is a schematic layout view showing a multiplexing unit according to an embodiment of the present disclosure. The structure of the multiplexing unit will be described below in conjunction with FIGS. 6A and 6B.

Referring to FIGS. 6A and 6B, at least one multiplexing unit 231 comprises a plurality of switch transistors 232, for example, two switch transistors 232 or more than two switch transistors 232. Here, FIGS. 6A and 6B schematically show two switch transistors 232. At least one switch transistor 232 comprises a second active layer 2321, a second gate 2322, two first electrodes 2323 and a second electrode 2324 located on one side of the base substrate 11. For example, the switch transistor 232 further comprises a gate dielectric layer 1212 located between the second gate 2322 and the second active layer 2321. In some embodiments, two adjacent switch transistors 232 share one first electrode 2323 of the two first electrodes 2323, so that the space occupied by the multiplexing unit 231 may be reduced.

The second gate 2322 is located on one side of the second active layer 2321 away from the base substrate 11. The second gate 2322 comprises a first gate portion 2322a and a second gate portion 2322b that are spaced apart. The first gate portion 2322a and the second gate portion 2322b are electrically connected to one of the plurality of control signal lines 36.

The two first electrodes 2323 are located on one side of the second gate 2322 away from the base substrate 11 and electrically connected to the second active layer 2321 and a data signal input line 31. A first insulating layer 1214 and a second insulating layer 1215 may be provided between the two first electrodes 2323 and the second gate 2322. For example, each first electrode 2323 may be electrically connected to the second active layer 2321 through a via penetrating the second insulating layer 1215, the first insulating layer 1214, and the gate dielectric layer 1212.

The second electrode 2324 is located on one side of the second gate 2322 away from the base substrate 11 and electrically connected to the second active layer 2321 and one of the at least two data lines electrically connected to the multiplexing unit 231. The orthographic projection of the second electrode 2324 on the base substrate 11 is located between the orthographic projections of the two first electrodes 2323 on the base substrate 11. In some embodiments, the second electrode 2324 and the first electrode 2323 are located in a same layer. For example, the first insulating layer 1214 and the second insulating layer 1215 are provided between the second electrode 2324 and the second gate 2322. For example, the second electrode 2324 may be electrically connected to the second active layer 2321 through a via penetrating the second insulating layer 1215, the first insulating layer 1214, and the gate dielectric layer 1212.

In addition, the switch transistor 232 may further comprise a buffer layer between the base substrate 11 and the second active layer 2321, and a planarization layer 125 covering the second electrode 2324 and the first electrode 2323.

In the above embodiments, the second gate 2322 of the switch transistor 232 comprises a first gate portion 2322a and a second gate portion 2322b that are spaced apart. When the switch transistor 232 is turned on, carriers pass through the second active layer 2321 between each of the two first electrodes 2323 and the second electrode 2324. For example, the first gate portion 2322a and the second gate portion 2322b extend along a first direction. The channel of the switch transistor 232 comprises a portion of the second active layer 2321 overlapping with the first gate portion 2322a and a portion of the second active layer 2321 overlapping with the second gate portion 2322b. Therefore, with the second gate 2322 being provided as two gate portions that are spaced apart, a length of the multiplexing unit 231 along the first direction in a case where there is a constant width-to-length ratio of the channel of the switch transistor 232 is reduced, which helps to reduce the frame size of the array substrate.

It should be understood that, in some embodiments, the second active layer 2321 of the switch transistor 232 may be referred to as a first active layer and the first active layer 1211 of the driving transistor 121 may be referred to as a second active layer.

In some embodiments, referring to FIG. 6A, the second active layer 2321 of the switch transistor 232 and the first active layer 1211 of the driving transistor 121 are located in a same layer, the second gate 2322 of the switch transistor 232 and the first gate 1213 of the driving transistor 121 are located in a same layer, the two first electrodes 2323 and the second electrode 2324 of the switch transistor 232 are located in a same layer as the source 1216 and the drain 1217 of the driving transistor 121. In other words, the switch transistor 232 may be formed in the process of forming the driving transistor 121, thereby simplifying the process flow.

In some embodiments, referring to FIG. 6B, at least one switch transistor 232 further comprises at least one of an electrode connecting portion 2325 or a gate connecting portion 2326. For example, the two first electrodes 2323 and the electrode connecting portion 2325 are integrally provided. For example, the first gate portion 2322*a*, the second gate portion 2322*b*, and the gate connecting portion 2326 are integrally provided.

The orthographic projection of the electrode connecting portion 2325 on the base substrate 11 is located between the orthographic projection of the second active layer 2321 on the base substrate 11 and the orthographic projections of the plurality of control signal lines 36 on the base substrate 11. The two first electrodes 2323 are electrically connected to the data signal input line 31 through the electrode connecting portion 2325. For example, an end of the first electrode 2323 is connected to the electrode connecting portion 2325.

The orthographic projection of the gate connecting portion 2326 on the base substrate 11 is located between the orthographic projection of the second active layer 2321 on the base substrate 11 and the orthographic projection of the electrode connecting portion 2325 on the base substrate 11. The first gate portion 2322*a* and the second gate portion 2322*b* are electrically connected to a control signal line 36 through the gate connecting portion 2326. For example, an end of the first gate portion 2322*a* and an end of the second gate portion 2322*b* are connected to the gate connecting portion 2326.

In the above embodiments, the switch transistor 232 further comprises at least one of the electrode connecting portion 2325 or the gate connecting portion 2326. Such a structure facilitates the electrical connection between the data signal input line 31 and the first electrode 2323, and the electrical connection between the control signal line 36 and the second gate 2322.

In some embodiments, the orthographic projection of the first gate portion 2322*a* on the base substrate 11 is located between the orthographic projection of one of the two first electrodes 2323 on the base substrate 11 and the orthographic projection of the second electrode 2324 on the base substrate 11, and the orthographic projection of the second gate portion 2322*b* on the base substrate 11 is located between the orthographic projection of the other of the two first electrodes 2323 on the base substrate 11 and the orthographic projection of the second electrode 2324 on the base substrate 11. For example, the first gate portion 2322*a*, the second gate portion 2322*b*, the two first electrodes 2323, and the second electrode 2324 all extend along the first direction. Such a structure is favorable for reducing the size of the switch transistor 232 in a direction perpendicular to the first direction, thereby reducing the space occupied by the multiplexing unit 231.

In some embodiments, referring to FIG. 6B, the second active layer 2321 comprises a first active portion 2321*a* and a second active portion 2321*b* spaced apart from each other. The second active portion 2321*b* is located between the first active portion 2321*a* and the display area 111. Each first electrode 2323 and the second electrode 2324 are electrically connected to the first active portion 2321*a* through a plurality of first vias V1 respectively, and each first electrode 2323 and the second electrode 2324 are electrically connected to the second active portion 2321*b* through with a plurality of second vias V2 respectively. For example, each first electrode 2323 and the second electrode 2324 extend along the first direction, and the plurality of first vias V1 and the plurality of second vias V2 may be arranged along the first direction.

In the above embodiments, the second active layer 2321 comprises a first active portion 2321*a* and a second active portion 2321*b* spaced apart from each other. Such a structure is favorable for heat dissipation of the switch transistor 232 and may improve the reliability of the multiplexing unit 231.

It should be understood that the multiplexing unit in the array substrate provided by different embodiments of the present disclosure may be the multiplexing unit described in any one of the above embodiments.

In some embodiments, referring to FIGS. 5A, 5B, and 6A, the array substrate further comprises a plurality of power lines 16 and a first power bus 33. The plurality of power lines 16 are located at the display area 111, and electrically connected to the plurality of sub-pixels 12. The plurality of power lines 16 is configured to provide a first power signal to the plurality of sub-pixels 12. The first power bus 33 is located at least in the first peripheral area 112A, and electrically connected to the plurality of power lines 16 located at the display area 111. The orthographic projection of a portion of the first power bus 33 located at the first peripheral area 112A on the base substrate 11 is located on one side of the orthographic projections of the plurality of control signal lines 36 on the base substrate 11 away from the display area 111.

In some embodiments, referring to FIG. 5B, the plurality of multiplexing units 231 in the multiplexing circuit 23 comprise a plurality of first multiplexing units 231A located at the first peripheral area 112A. The array substrate also comprises a plurality of power bus connectors 37 and a second power bus 38.

A plurality of power bus connectors 37 is located at the first peripheral area 112A. The orthographic projection of each power bus connector 37 on the base substrate 11 is located between the orthographic projections of two adjacent first multiplexing units 231A of the plurality of first multiplexing units 231A on the base substrate 11. Referring to FIG. 6B, at least one power bus connector 37 comprises a first connecting layer 371 and a second connecting layer 372 which are located in different layers. For example, the first connecting layer 371 and the second gate 2322 are located in a same layer. For example, the second connecting layer 372 and the second electrode plate 1222 of the storage capacitor 122 in the sub-pixel 12 are located in a same layer.

The second power bus 38 is located at least at the first peripheral area 112A and located between the multiplexing circuit 23 and the display area 111. For example, the second power bus 38 may also be located at the corner area 112B. Here, the second power bus 38 is electrically connected to the first power bus 33 through the plurality of power bus connectors 37. For example, the second power bus 38 is connected to the first connecting layer 371 through a via and connected to the second connecting layer 372 through another via. Similarly, the second power bus 33 is connected to the first connecting layer 371 through a via and connected to the second connecting layer 372 through another via.

In the above embodiments, the power bus connector 37 comprises a first connecting layer 371 and a second connecting layer 372 which are located in different layers. Such a structure may reduce the resistance of the power bus connector 37 in a case where a lateral size of the power bus connector 37 (i.e., the size in a direction perpendicular to the extending direction of the power bus connector 37) is reduced, so that the voltages of the first power signals provided to different sub-pixels 12 are closer to each other, thereby considering both the frame size of the array substrate and the display uniformity of the array substrate.

In some embodiments, referring to FIG. 6A, the orthographic projection of the first connecting layer 371 on the base substrate 11 at least partially overlaps (for example, completely overlaps) with the orthographic projection of the second connecting layer 372 on the base substrate 11.

The inventor has also noticed that a wiring conflict is likely to occur between a signal line that provides a control signal to the control signal line and other signal lines (for example, the first power signal bus, the data signal input line, or the like). In view of the above, the embodiments of the present disclosure also provide the following technical solutions.

Figure 7A:
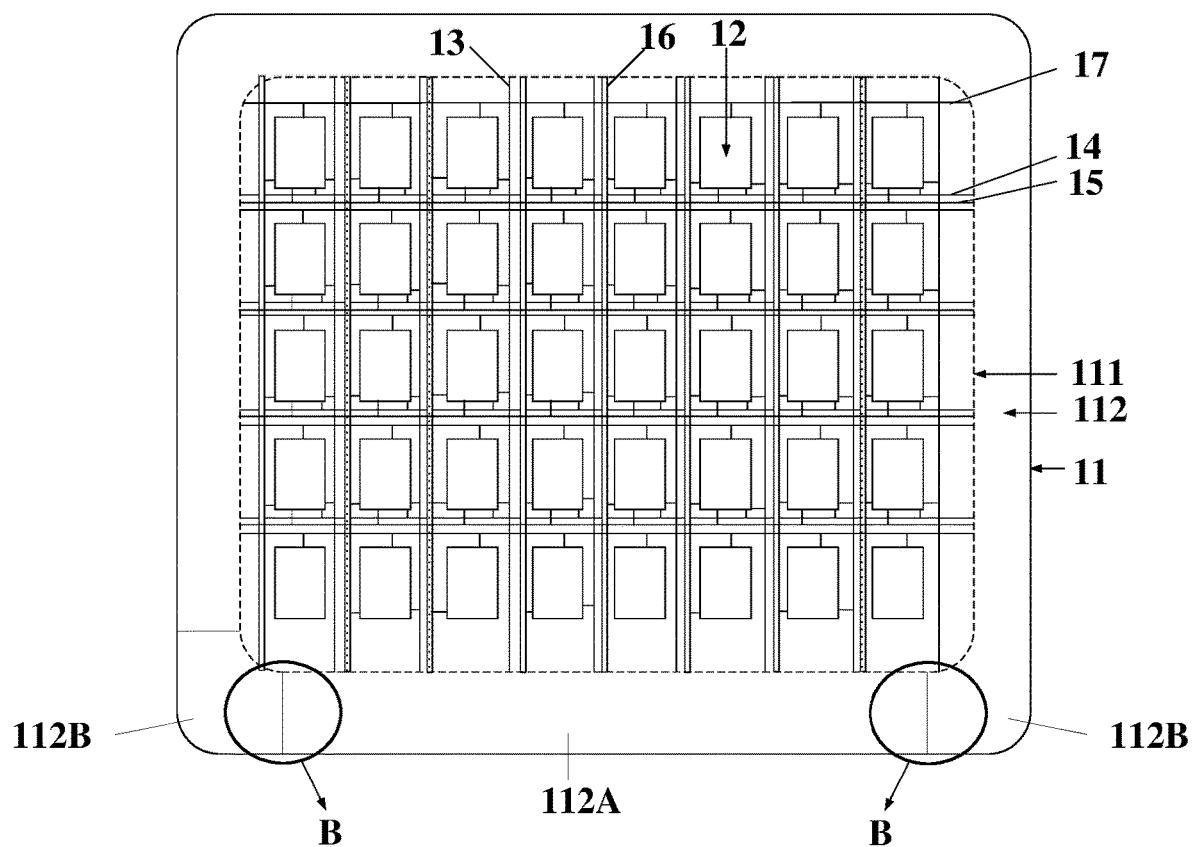
FIG. 7A is a schematic structure view showing an array substrate according to still another embodiment of the present disclosure.
Figure 7B:
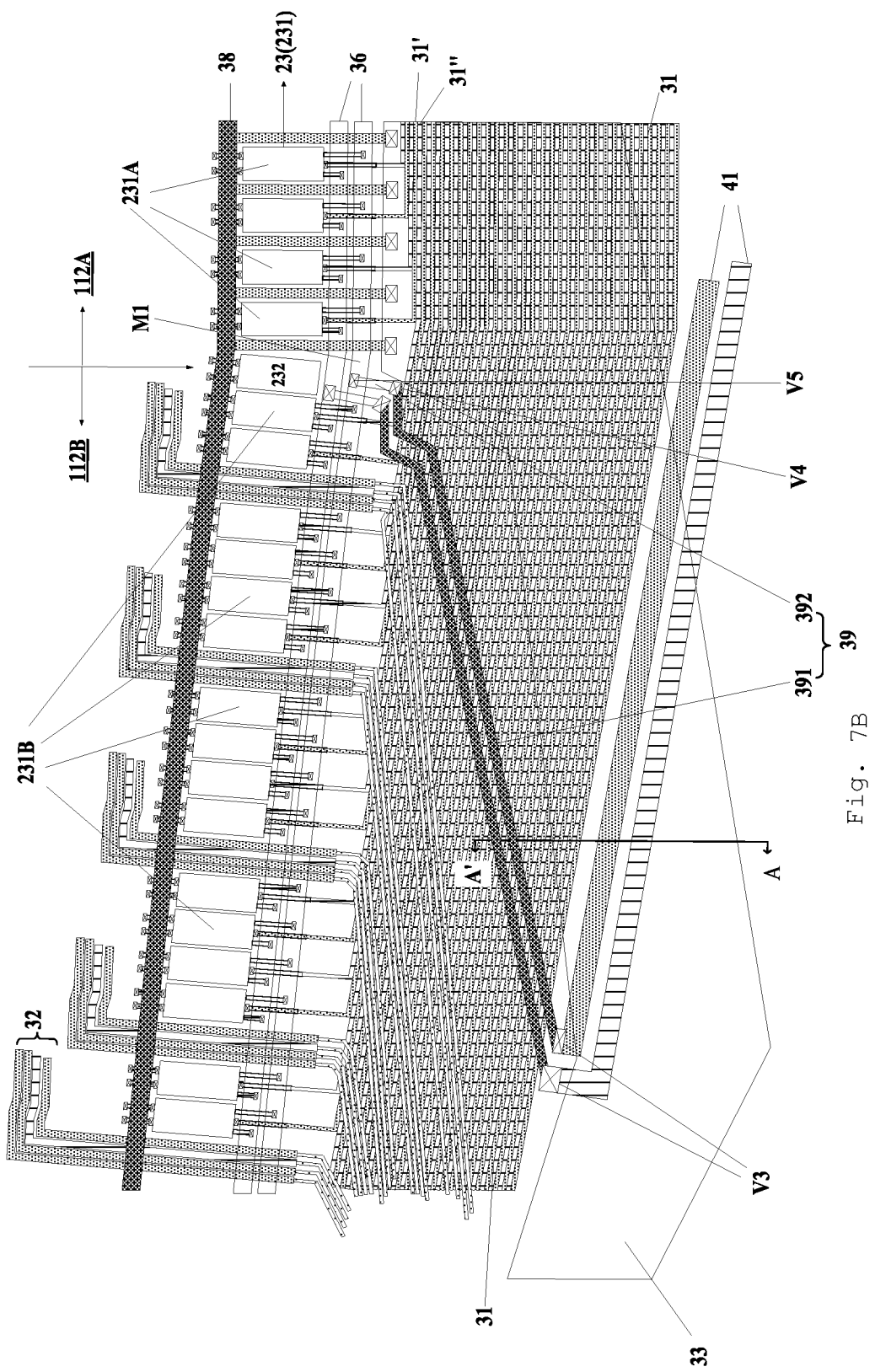
FIG. 7B is an enlarged schematic view showing a partial area in the circle B of the array substrate shown in FIG. 7A.

FIG. 7A is a schematic structure view showing an array substrate according to still another embodiment of the present disclosure. FIG. 7B is an enlarged schematic view showing a partial area in the circle B of the array substrate shown in FIG. 7A. It should be understood that at least one of two circles B shown in FIG. 7A may comprise the structure shown in FIG. 7B.

As shown in FIGS. 7A and 7B, the array substrate comprises a base substrate 11, a plurality of sub-pixels 12, a plurality of data lines 13, a plurality of power lines 16, a multiplexing circuit 23, a plurality of data signal input lines 31, a plurality of control signal lines 36, a plurality of control signal connecting lines 39, and a plurality of control signal input lines 41.

Referring to FIG. 7A, the base substrate 11 comprises a display area 111 and a peripheral area 112 surrounding the display area 111. The peripheral area 112 comprises a first peripheral area 112A located on one side of the display area 111 and a corner area 112B adjacent to the first peripheral area 112A.

The plurality of data lines 13 is located at the display area 111 and electrically connected to the plurality of sub-pixels 12 located at the display area 111. The plurality of data lines 13 is configured to provide a data signal to the plurality of sub-pixels 12. For example, each data line 13 is electrically connected to a column of sub-pixels 12.

The plurality of power lines 16 is located at the display area 111, and electrically connected to the plurality of sub-pixels 12. The plurality of power lines 16 is configured to provide a first power signal to the plurality of sub-pixels 12. For example, each of the plurality of power lines 16 is electrically connected to a column of sub-pixels 12.

Referring to FIG. 7B, the plurality of data signal input lines 31, the plurality of control signal lines 36, and the multiplexing circuit 23 are located at the first peripheral area 112A and the corner area 112B. The multiplexing circuit 23 is located on one side of the plurality of control signal lines 36 close to the display area 111. The multiplexing circuit 23 comprises a plurality of multiplexing units 231. At least one multiplexing unit 231 is electrically connected to a data signal input line 31 of the plurality of data signal input lines 31 and at least two data lines 13 of the plurality of data lines 13.

The first power bus 33 is located at the first peripheral area 112A and the corner area 112B, and electrically connected to the plurality of power lines 16. Here, the first power bus 33 and the plurality of data signal input lines 31 are located in different layers.

The plurality of control signal connecting lines 39 and the plurality of data signal input lines 31 are located in different layers. Each of the plurality of control signal connecting lines 39 is electrically connected to one of the plurality of control signal lines 36. Here, the orthographic projection of the third via V3 on the base substrate 11 is located between the orthographic projection of a portion of the first power bus 33 located at the corner area 112B on the base substrate 11 and the orthographic projections of the plurality of data signal input lines 31 on the base substrate 11.

In the above embodiments, the plurality of data signal input lines 31 and the first power bus 33 are located in different layers, the plurality of control signal input lines 41 and the first power bus 33 are located in different layers, the plurality of control signal connecting lines 39 and the plurality of data signal input lines 31 are located in different layers, and the plurality of control signal connecting lines 39 is located between the first power bus 33 and the display area 111. In this manner, the plurality of control signal connecting lines 39 is spaced apart from the first power bus 33 and at least partially overlaps with the plurality of data signal input lines 31, thereby avoiding a wiring conflict between the plurality of control signal connecting lines 39 and the first power bus 33 and a wiring conflict between the control signal connecting lines 39 and the data signal input lines 31.

In some embodiments, referring to FIG. 7B, the orthographic projections of the plurality of control signal input lines 41 on the base substrate 11 pass through the orthographic projection of the first power bus 33 on the base substrate 11. In other words, the orthographic projections of the plurality of control signal input lines 41 on the base substrate 11 overlap with the orthographic projection of the first power bus 33 on the base substrate 11. Each control signal connecting line 39 comprises a first control signal connecting portion 391 located in a same layer as the first power bus 33. The first control signal connecting portion 391 is electrically connected to one of the control signal input lines 41 through the third via V3. The orthographic projection of the first control signal connecting portion 391 on the base substrate 11 passes through the orthographic projections of the plurality of data signal input lines 31 on the base substrate 11. In other words, the orthographic projection of the first control signal connecting portion 391 on the base substrate 11 overlaps with the orthographic projections of the plurality of data signal input lines 31 on the base substrate 11.

In the above embodiments, the first control signal connecting portion 391 and the first power bus 33 are located in a same layer, thus a control signal can be provided to the control signal line 36 without adding an metal layer, which simplifies the process flow and saves the cost.

In some embodiments, the plurality of control signal input lines 41 and the plurality of data signal input lines 31 are located in a same layer as at least one of the first electrode plate 1221 or the second electrode plate 1222 of the storage capacitor 122 in the sub-pixel 12 shown in FIG. 3. In some embodiments, the first power bus 33, and the source 1216 and the drain 1217 of the driving transistor 121 in the sub-pixel 12 shown in FIG. 3 are located in a same layer.

Figure 8:
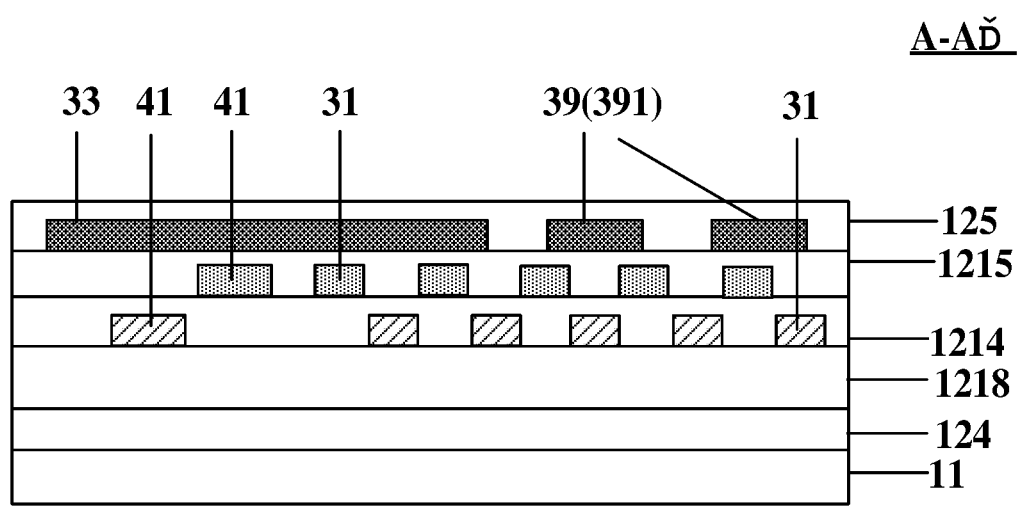
FIG. 8 is a schematic cross-sectional view taken along A-A' shown in FIG. 7B.

FIG. 8 is a schematic cross-sectional view taken along A-A' shown in FIG. 7B.

As shown in FIG. 8, in some embodiments, one of two adjacent control signal input lines 41 of the plurality of control signal input lines 41 is located in a same layer as the first electrode plate 1221, and the other is located in a same layer as the second electrode plate 1222. In some embodiments, one of two adjacent data signal input lines 31 of the plurality of data signal input lines 31 is located in a same layer as the first electrode plate 1221, and the other is located in a same layer as the second electrode plate 1222. In this manner, the space occupied by the plurality of control signal input lines 41 and the plurality of data signal input lines 31 is reduced, which helps to further reduce the frame size of the array substrate.

In some embodiments, referring to FIG. 7B, each control signal connecting line 39 further comprises a second control signal connecting portion 392 located in a different layer from the first control signal connecting portion 391. The second control signal connecting portion 392 is electrically connected to a control signal line 36, and electrically connected to the first control signal connecting portion 391 through the fourth via V4. The orthographic projection of the fourth via V4 on the base substrate 11 is located between the orthographic projections of the plurality of control signal lines 36 on the base substrate 11 and the orthographic projections of the plurality of data signal input lines 31 on the base substrate 11. In this manner, since each control signal connecting line 39 comprises the first control signal connecting portion 391 and the second control signal connecting portion 392, the voltages of the control signals provided to the plurality of control signal lines 39 are closer to each other, which helps to improve the display uniformity of the plurality of sub-pixels 12. In addition, the space between different signal lines may be fully utilized, which helps to further reduce the frame size of the array substrate.

In some embodiments, the plurality of multiplexing units 231 comprises a plurality of first multiplexing units 231A located at the first peripheral area 112A and a plurality of second multiplexing units 231B located at the corner area 112B. The data signal input line 31 connected to the plurality of first multiplexing units 231A which is closest to the corner area 112B is a first data signal input line 31', and the data signal input line 31 connected to one of the plurality of second multiplexing units 231B which is closest to the first peripheral area 112A is a second data signal input line 31". A portion of the orthographic projection of each control signal line 36 on the base substrate 11, which is located between the orthographic projection of the first data signal input line 31' on the base substrate 11 and the orthographic projection of the second data signal input line 31" on the base substrate 11, is a first projection M1. Each second control signal connecting portion 392 is electrically connected to a corresponding control signal line 36 through the fifth via V5. Here, the orthographic projection of the fifth via V5 on the base substrate 11 overlaps with the first projection M1. For example, the orthographic projection of the fifth via V5 on the base substrate 11 is located within the first projection M1.

In some embodiments, the multiplexing circuit 23 further comprises a dummy multiplexing unit 232 located between the multiplexing first multiplexing unit 231A and the multiplexing second multiplexing unit 231B. Here, the position of the dummy multiplexing unit 232 may be regarded as a border position between the first peripheral area 112A and the corner area 112B. For example, the structure of the dummy multiplexing unit 232 may be the same as the structure of the multiplexing unit 231. The dummy multiplexing unit 232 is not electrically connected to the plurality of data signal input lines 31 and the plurality of data lines 13. The dummy multiplexing unit 232 helps to ensure the uniformity of the plurality of multiplexing units 231 during the forming process.

The array substrates according to different embodiments of the disclosure are described above. It should be noted that the array substrates in different embodiments of the present disclosure may be combined with each other.

Figure 9A:
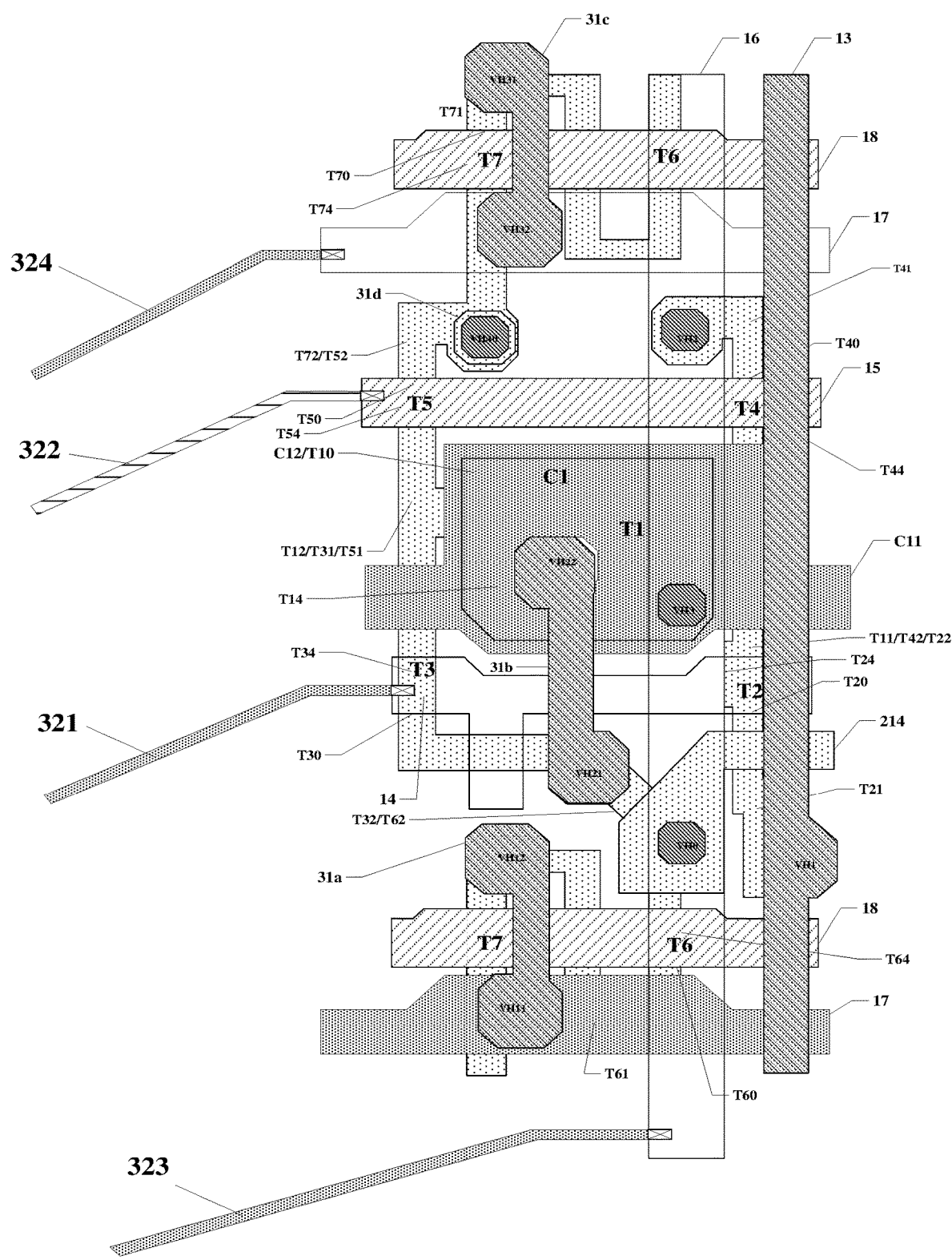
FIG. 9A is a schematic layout view showing the connection between a pixel circuit of a sub-pixel and a group of connecting lines according to an embodiment of the present disclosure.
Figure 9B:
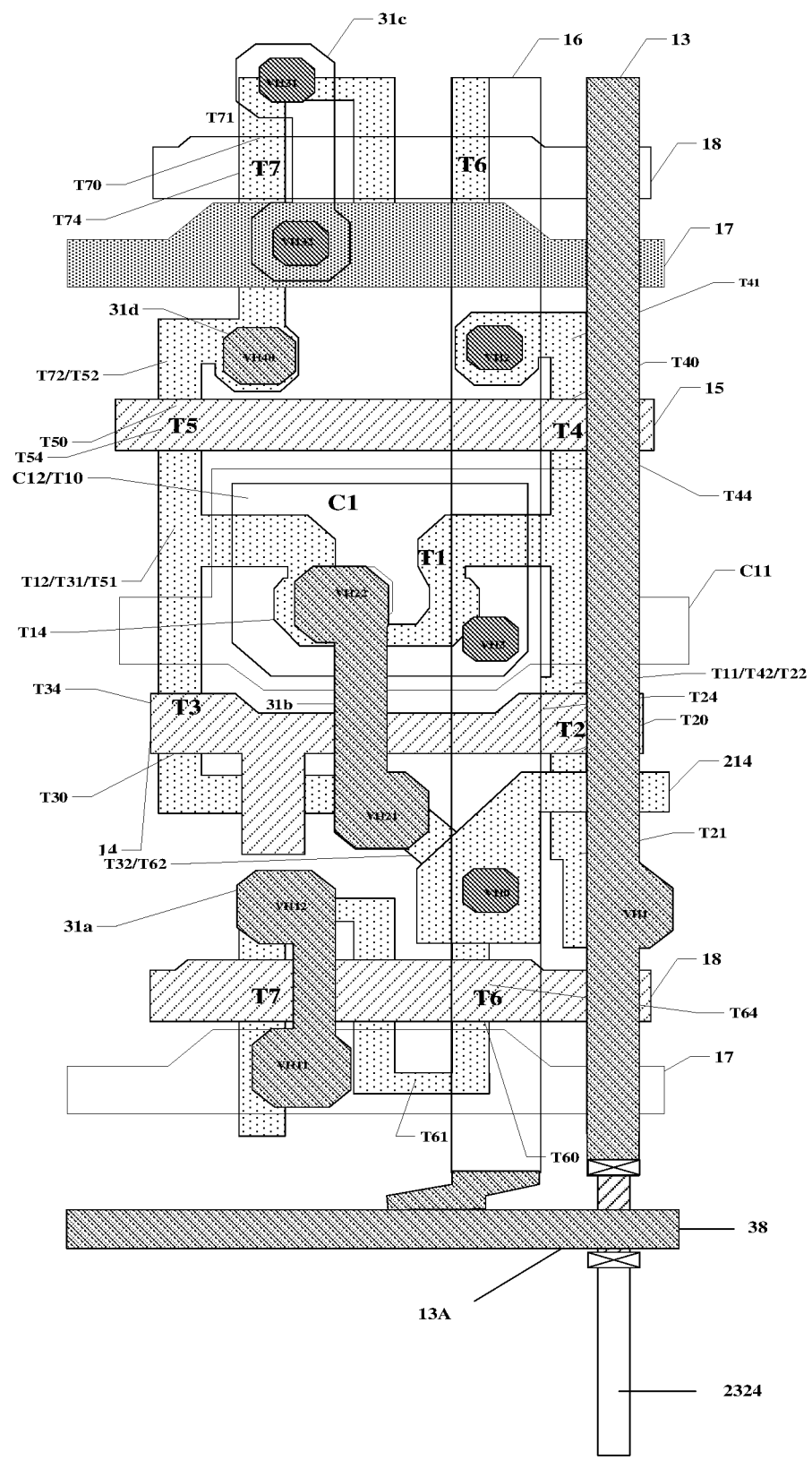
FIG. 9B is a schematic layout view showing the connection between a pixel circuit of a sub-pixel and a multiplexing unit according to an embodiment of the present disclosure.

FIG. 9A is a schematic layout view showing the connection between a pixel circuit of a sub-pixel and a group of connecting lines according to an embodiment of the present disclosure. FIG. 9B is a schematic layout view showing the connection between a pixel circuit of a sub-pixel and a multiplexing unit according to an embodiment of the present disclosure.

As shown in FIGS. 9A and 9B, the pixel circuit of the sub-pixel may comprise a driving transistor T1 (that is, the above driving transistor 121), a data writing transistor T2, a threshold compensation transistor T3, a first light emitting control transistor T4, a second light emitting control transistor T5, a first reset transistor T6 (located at the lower right corner of FIG. 9), a second reset transistor T7 (located at the upper left corner of FIG. 9), and a storage capacitor C1 (that is, the above storage capacitor 122).

The driving transistor T1 comprises a channel area T14, the data writing transistor T2 comprises a channel area T24, the threshold compensation transistor T3 comprises a channel area T34, the first light emitting control transistor T4 comprises a channel area T44, the second light emitting control transistor T5 comprises a channel area T54, the first reset transistor T6 comprises a channel area T64, and the second reset transistor T7 comprises a channel area T74.

The gate T20 of the data writing transistor T2 is electrically connected to the gate line 14, the first electrode T21 of the data writing transistor T2 is electrically connected (for example through a via VH1) to the data line 13, and the second electrode T22 of the data writing transistor T2 is electrically connected to the first electrode T11 of the driving transistor T1.

The gate T30 of the threshold compensation transistor T3 is electrically connected to the gate line 14, the first electrode T31 of the threshold compensation transistor T3 is electrically connected to the second electrode T12 of the driving transistor T1, and the second electrode T32 of the threshold compensation transistor T3 is electrically connected to the gate T10 (that is, the second electrode plate C12 of the storage capacitor) of the driving transistor T1 through a connecting electrode 31b.

The gate T40 of the first light emitting control transistor T4 and the gate T50 of the second light emitting control transistor T5 are both electrically connected to the light emitting control line 15. For example, a portion of the light emitting control line 15 serves as the gate T40 of the first light emitting control transistor T4, and another portion of the light emitting control line 110 serves as the gate T50 of the second light emitting control transistor T5. The first electrode T41 of the first light emitting control transistor T4 is electrically connected to the power line 16 (for example, through a via VH2), and the second electrode T42 of the first light emitting control transistor T4 is electrically connected to the first electrode T11 of the driving transistor T1. The first electrode T51 of the second light emitting control transistor T5 is electrically connected to the second electrode T12 of the driving transistor T1, and the second electrode T52 of the second light emitting control transistor T5 is electrically connected to the first electrode 1231 of the light emitting diode 123 (see FIG. 3). For example, the second electrode T52 of the second light emitting control transistor T5 is electrically connected to the first electrode 1231 of the light emitting diode 123 through a connecting electrode 31d. For example, the second electrode T52 of the second light emitting control transistor T5 is electrically connected to the connecting electrode 31d through a via VH40.

The gate T60 of the first reset transistor T6 is electrically connected to the reset control line 18, the first electrode T61 of the first reset transistor T6 is electrically connected to the initialization signal line 17 through a connecting electrode 31a, and the second electrode T62 of the first reset transistor T6 is electrically connected to the gate T10 of the driving transistor T1 through the connecting electrode 31b. For example, the first electrode T61 of the first reset transistor T6 is electrically connected to one end of the connecting electrode 31a through a via VH11. The initialization signal line 17 is electrically connected to the other end of the connecting electrode 31a through a via VH12. For example, the second electrode T62 of the first reset transistor T6 is electrically connected to one end of the connecting electrode 31b through a via VH21, and the gate T10 of the driving transistor T1 is connected to the other end of the electrode 31b through a via VH22.

The gate T70 of the second reset transistor T7 is electrically connected to another reset control line 18, the first electrode T71 of the second reset transistor T7 is electrically connected to another initialization signal line 17 through a connecting electrode 31c, and the second electrode T72 of the second reset transistor T7 is electrically connected to the first electrode 1231 of the light emitting diode 123 (see FIG. 3). For example, the first electrode T71 of the second reset transistor T7 is electrically connected to one end of the connecting electrode 31c through a via VH31, and the another initialization signal line 17 is electrically connected to the other end of the connecting electrode 31c through a via VH32.

The first electrode plate C11 of the storage capacitor C1 is electrically connected to the power line 16 (for example, through a via VH3). The power line 16 is connected to the connection element 214 through a via VH0.

As shown in FIG. 9A, the gate connecting line 321 is electrically connected to the gate line 14, the light emitting control connecting line 322 is electrically connected to the light emitting control line 15, the power connecting line 323 is electrically connected to the power line 16, and the initialization connecting line 324 is electrically connected to the initialization signal line 17.

As shown in FIG. 9B, the second power bus 38 is electrically connected to the power line 16, and the second electrode 2324 in the multiplexing unit is electrically connected to the data line 13 (for example, through the data line lead 13A).

The embodiments of the present disclosure further provide a method for manufacturing an array substrate, comprising the steps of: providing a base substrate comprising a display area, and a peripheral area surrounding the display area and comprising a first peripheral area located on one side of the display area and a corner area adjacent to the first peripheral area; forming a plurality of sub-pixels located at the display area; forming a plurality of data lines located at the display area, electrically connected to the plurality of sub-pixels, and configured to provide a data signal to the plurality of sub-pixels; forming a plurality of gate lines located at the display area, electrically connected to the plurality of sub-pixels, and configured to provide a gate signal to the plurality of sub-pixels; forming a plurality of light emitting control lines located at the display area, electrically connected to the plurality of sub-pixels, and configured to provide a light emitting control signal to the plurality of sub-pixels; forming a plurality of groups of connecting lines located at least at the corner area, wherein each group of connecting lines comprises a plurality of connecting lines comprising a gate connecting line electrically connected to one of the plurality of gate lines and a light emitting control connecting line electrically connected to one of the light emitting control lines; forming a gate driving circuit located at least at the corner area, and comprising a plurality of gate driving units electrically connected to the plurality of gate lines through the gate connecting line in the plurality of groups of connecting lines; forming a light emitting control driving circuit located at least at the corner area, located on one side of the gate driving circuit away from the display area, and comprising a plurality of light emitting control driving units electrically connected to the plurality of light emitting control lines through the light emitting control connecting line in the plurality of groups of connecting lines; forming a plurality of data signal input lines located at least in the corner area; and forming a multiplexing circuit located at least at the corner area, located on one side of the gate driving circuit close to the display area, and comprising a plurality of multiplexing units, wherein at least one multiplexing unit is electrically connected to one of the plurality of data signal input lines and at least two of the plurality of data lines. The orthographic projection of each of the plurality of connecting lines on the base substrate passes between the orthographic projections of two adjacent multiplexing units of the plurality of multiplexing units on the base substrate, and does not overlap with the orthographic projections of the plurality of multiplexing units on the base substrate.

In the above embodiments, the gate driving circuit is electrically connected to the plurality of gate lines of located at the display area through the gate connecting lines of the plurality of connecting lines, and the light emitting control driving circuit is electrically connected to the light emitting control lines located at the display area through the light emitting control connecting lines in the plurality of groups of connecting lines. The gate connecting line and the light emitting control connecting line pass between two adjacent multiplexing units and do not overlap with the orthographic projection of each multiplexing unit on the base substrate. In this manner, the gate connecting line and the multiplexing circuit, and the light emitting control connecting line and the multiplexing circuit are less affected by each other.

The embodiments of the present disclosure further provide another method for manufacturing an array substrate, comprising the steps of: providing a base substrate comprising a display area, and a peripheral area surrounding the display area and comprising a first peripheral area located on one side of the display area and a corner area adjacent to the first peripheral area; forming a plurality of sub-pixels located at the display area; forming a plurality of data lines located at the display area, electrically connected to the plurality of sub-pixels, and configured to provide a data signal to the plurality of sub-pixels; forming a plurality of control signal lines located at least at the first peripheral area; forming a plurality of data signal input lines located at least at the first peripheral area; and forming a multiplexing circuit.

The multiplexing circuit is located at least at the first peripheral area and located on one side of the plurality of control signal lines close to the display area. The multiplexing circuit comprises a plurality of multiplexing units. At least one of the plurality of multiplexing units is electrically connected to the plurality of control signal lines, one of the plurality of data signal input lines, and at least two of the plurality of data lines. The at least one multiplexing unit comprises a plurality of switch transistors. The at least one switch transistor comprises: a first active layer located on one side of the base substrate; a first gate located on one side of the first active layer away from the base substrate, and comprising a first gate portion and a second gate portion which are spaced apart from each other and electrically connected to one of the plurality of control signal lines; two first electrodes located on one side of the first gate away from the base substrate and electrically connected to the first active layer and the one of the plurality of data signal input lines; and a second electrode located on one side of the first gate away from the base substrate and electrically connected to the first active layer and one of the at least two data lines, wherein the orthographic projection of the second electrode on the base substrate is located between the orthographic projections of the two first electrodes on the base substrate.

In the above embodiments, the second gate of the switch transistor comprises a first gate portion and a second gate portion that are spaced apart. When the switch transistor is turned on, carriers pass through the first active layer between each of the two first electrodes and the second electrode. For example, the first gate portion and the second gate portion extend along a first direction. The channel of the switch transistor comprises a portion of the first active layer overlapping with the first gate portion and a portion of the first active layer overlapping with the second gate portion. Therefore, with the second gate being provided as two gate portions that are spaced apart, a length of the multiplexing unit along the first direction in a case where there is a constant width-to-length ratio of the channel of the switch transistor is reduced, which helps to reduce the frame size of the array substrate.

The embodiments of the present disclosure further provide still another method for manufacturing an array substrate, comprising the steps of: providing a base substrate comprising a display area, and a peripheral area surrounding the display area and comprising a first peripheral area located on one side of the display area and a corner area adjacent to the first peripheral area; forming a plurality of sub-pixels located at the display area; forming a plurality of data lines located at the display area, electrically connected to the plurality of sub-pixels, and configured to provide a data signal to the plurality of sub-pixels; forming a plurality of power lines located at the display area, electrically connected to the plurality of sub-pixels, and configured to provide a first power signal to the plurality of sub-pixels; forming a plurality of control signal lines located at the first peripheral area and the corner area; forming a plurality of data signal input lines located at the first peripheral area and the corner area; forming a multiplexing circuit located at the first peripheral area, located on one side of the plurality of control signal lines close to the display area, and comprising a plurality of multiplexing units, wherein at least one of the plurality of multiplexing units is electrically connected to the plurality of control signal lines, one of the plurality of data signal input lines, and at least two of the plurality of data lines; forming a first power bus located at the first peripheral area and the corner area, electrically connected to the plurality of power lines, and located in a different layer from the plurality of data signal input lines; forming a plurality of control signal connecting lines located in a different layer from the plurality of data signal input lines, and located between the first power bus and the display area, each of the plurality of control signal connecting lines is electrically connected to one of the plurality of control signal lines; and forming a plurality of control signal input lines located in a different layer from the first power bus, wherein each of the plurality of control signal input lines is electrically connected to one of the control signal connecting lines via a third via, and the orthographic projection of the third via on the base substrate is located between the orthographic projection of a portion of the first power bus line located at the corner area on the base substrate and orthographic projections of the plurality of data signal input lines on the base substrate.

In the above embodiments, the plurality of data signal input lines and the first power bus are located in different layers, the plurality of control signal input lines and the first power bus are located in different layers, the plurality of control signal connecting lines and the plurality of data signal input lines are located in different layers, and the plurality of control signal connecting lines is located between the first power bus and the display area. In this manner, the plurality of control signal connecting lines is spaced apart from the first power bus and at least partially overlaps with the plurality of data signal input lines, thereby avoiding a wiring conflict between the plurality of control signal connecting lines and the first power bus and a wiring conflict between the control signal connecting lines and the data signal input lines.

The present disclosure also provides a display device, which may comprise the array substrate according to any one of the above embodiments. In some embodiments, the display device may be any product or member with a display function, such as a display panel, a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. An array substrate, comprising:
a base substrate comprising a display area and a peripheral area surrounding the display area, wherein the peripheral area comprises a first peripheral area located on one side of the display area;
a plurality of sub-pixels located at the display area;
a plurality of data lines located at the display area, electrically connected to the plurality of sub-pixels, and configured to provide a data signal to the plurality of sub-pixels;
a plurality of control signal lines located at least at the first peripheral area;
a plurality of data signal input lines located at least at the first peripheral area; and
a multiplexing circuit located at least at the first peripheral area, located on one side of the plurality of control signal lines close to the display area, and comprising a plurality of multiplexing units, wherein at least one of the plurality of multiplexing units is electrically connected to the plurality of control signal lines, a data signal input line of the plurality of data signal input lines, and at least two data lines of the plurality of data lines, and comprises a plurality of switch transistors, wherein at least one of the plurality of switch transistors comprises:
a second active layer located on one side of the base substrate,
a second gate located on one side of the second active layer away from the base substrate, and comprising a first gate portion and a second gate portion that are spaced apart and electrically connected to a control signal line of the plurality of control signal lines,
two first electrodes located on one side of the second gate away from the base substrate and electrically connected to the second active layer and the data signal input line, and
a second electrode located on one side of the second gate away from the base substrate and electrically connected to the second active layer and one of the at least two data lines, wherein an orthographic projection of the second electrode on the base substrate is located between orthographic projections of the two first electrodes on the base substrate.

2. The array substrate according to claim 1, wherein the plurality of switch transistors comprises two switch transistors which share one of the two first electrodes.

3. The array substrate according to claim 1, wherein the at least one switch transistor further comprises at least one of an electrode connecting portion or a gate connecting portion, wherein:
an orthographic projection of the electrode connecting portion on the base substrate is located between an orthographic projection of the second active layer on the base substrate and orthographic projections of the plurality of control signal lines on the base substrate, and the two first electrodes are electrically connected to the data signal input line through the electrode connecting portion, and
an orthographic projection of the gate connecting portion on the base substrate is located between the orthographic projection of the second active layer on the base substrate and the orthographic projection of the electrode connecting portion on the base substrate, and the first gate portion and the second gate portion are electrically connected to the control signal line through the gate connecting portion.

4. The array substrate according to claim 3, wherein the two first electrodes and the electrode connecting portion are integrally provided, and the first gate portion, the second gate portion and the gate connecting portion are integrally provided.

5. The array substrate according to claim 1, wherein:
an orthographic projection of the first gate portion on the base substrate is located between an orthographic projection of one of the two first electrodes on the base substrate and an orthographic projection of the second electrode on the base substrate; and
an orthographic projection of the second gate portion on the base substrate is located between an orthographic projection of the other of the two first electrodes on the base substrate and the orthographic projection of the second electrode on the base substrate.

6. The array substrate according to claim 1, wherein the second active layer comprises:
a first active portion; and
a second active portion located between the first active portion and the display area, wherein each of the two first electrodes and the second electrode are electrically connected to the first active portion through a plurality of first vias respectively, and each of the two first electrodes and the second electrode are electrically connected to the second active portion through a plurality of second vias respectively.

7. The array substrate according to claim 6, wherein the two first electrodes and the second electrode extend along a first direction, and the plurality of first vias and the plurality of second vias are arranged along the first direction.

8. The array substrate according to claim 1, further comprising:
a plurality of power lines located at the display area, electrically connected to the plurality of sub-pixels, and configured to provide a first power signal to the plurality of sub-pixels; and
a first power bus located at least at the first peripheral area and electrically connected to the plurality of power lines, wherein an orthographic projection of a portion of the first power bus located at the first peripheral area on the base substrate is located on one side of an orthographic projections of the plurality of control signal lines on the base substrate away from the display area.

9. The array substrate according to claim 8, wherein the plurality of multiplexing units comprises a plurality of first multiplexing units located at the first peripheral area, and the array substrate further comprises:
a plurality of power bus connectors located at the first peripheral area, wherein an orthographic projection of at least one of the plurality of power bus connectors on the base substrate is located between orthographic projections of two adjacent first multiplexing units of the plurality of first multiplexing units on the base substrate, and the at least one of the plurality of power bus connectors comprises a first connecting layer and a second connection which are located in different layers; and
a second power bus located at least at the first peripheral area, located between the multiplexing circuit and the display area, and electrically connected to the first power bus through the plurality of power bus connectors.

10. The array substrate according to claim 9, wherein an orthographic projection of the first connecting layer on the base substrate at least partially overlaps with an orthographic projection of the second connecting layer on the base substrate.

11. The array substrate according to claim 1, wherein at least one of the plurality of sub-pixels comprises:
   a driving transistor, comprising:
      a first active layer located on the base substrate,
      a first gate located on one side of the first active layer away from the base substrate,
      a first insulating layer located on one side of the first gate away from the base substrate,
      a second insulating layer located on one side of the first insulating layer away from the base substrate, and
      a source and a drain which are located on one side of the second insulating layer away from the base substrate and electrically connected to the first active layer; and
   a storage capacitor, comprising:
      a first electrode plate located in a same layer as the first gate, and
      a second electrode plate located between the first insulating layer and the second insulating layer,
   wherein the second active layer and the first active layer are located in a same layer, the second gate and the first gate are located in a same layer, and the source, the drain, the two first electrodes and the second electrode are located in a same layer.

12. The array substrate according to claim 8, wherein the peripheral area further comprises a corner area adjacent to the first peripheral area, the first power bus is also located at the corner area, and the first power bus and the plurality of data signal input lines are located on different layers, and the array substrate further comprises:
   a plurality of control signal connecting lines located in a different layer from the plurality of data signal input lines and located between the first power bus and the display area, wherein each of the plurality of control signal connecting lines is electrically connected to one of the plurality of control signal lines; and
   a plurality of control signal input lines located in a different layer from the first power bus, wherein each of the plurality of control signal input lines is electrically connected to a control signal connecting line of the control signal connecting lines via a third via, and an orthographic projection of the third via on the base substrate is located between an orthographic projection of a portion of the first power bus line located at the corner area on the base substrate and orthographic projections of the plurality of data signal input lines on the base substrate.

13. The array substrate according to claim 12, wherein:
   orthographic projections of the plurality of control signal input lines on the base substrate pass through an orthographic projection of the first power bus on the base substrate; and
   each of the plurality of control signal connecting lines comprises a first control signal connecting portion located in a same layer as the first power bus, and electrically connected to one of the plurality of control signal input lines through the third via, wherein an orthographic projection of the first control signal connecting portion on the base substrate passes through the orthographic projections of the plurality of data signal input lines on the base substrate.

14. The array substrate according to claim 13, wherein at least one of the plurality of sub-pixels comprises:
   a driving transistor, comprising:
      a first active layer located on the base substrate,
      a first gate located on one side of the first active layer away from the base substrate,
      a first insulating layer located on one side of the first gate away from the base substrate,
      a second insulating layer located on one side of the first insulating layer away from the base substrate, and
      a source and a drain which are located on one side of the second insulating layer away from the base substrate and electrically connected to the first active layer; and
   a storage capacitor, comprising:
      a first electrode plate located in a same layer as the first gate, and
      a second electrode plate located between the first insulating layer and the second insulating layer,
   wherein the plurality of control signal input lines and the plurality of data signal input lines are located in a same layer as at least one of the first electrode plate or the second electrode plate, and the first power bus, the source and the drain are located in a same layer.

15. The array substrate according to claim 13, wherein each of the plurality of control signal connecting lines further comprises:
   a second control signal connecting portion located in a different layer from the first control signal connecting portion, electrically connected to the first control signal connecting portion through a fourth via, and electrically connected to the one of the plurality of control signal lines, wherein an orthographic projection of the fourth via on the base substrate is located between the orthographic projections of the plurality of control signal lines on the base substrate and the orthographic projections of the plurality of data signal input lines on the base substrate.

16. The array substrate according to claim 15, wherein:
   the plurality of multiplexing units comprises a plurality of first multiplexing units located at the first peripheral area and a plurality of second multiplexing units located at the corner area, wherein the data signal input line electrically connected to one of the plurality of first multiplexing units which is closest to the corner area is a first data signal input line, and the data signal input line electrically connected to one of the plurality of second multiplexing units which is closest to the first peripheral area is a second data signal input line;
   a portion of an orthographic projection of the one of the plurality of control signal lines on the base substrate, which is located between an orthographic projection of the first data signal input line on the base substrate and an orthographic projection of the second data signal input line on the base substrate, is a first projection; and
   the second signal connecting portion is electrically connected to the one of the plurality of control signal lines through a fifth via, wherein an orthographic projection of the third via on the base substrate overlaps with the first projection.

17. The array substrate according to claim 16, wherein the multiplexing circuit further comprises:
   a dummy multiplexing unit located between the plurality of first multiplexing units and the plurality of second multiplexing units.

18. The array substrate according to claim 12, further comprising:
- a plurality of gate lines located at the display area, electrically connected to the plurality of sub-pixels, and configured to provide a gate signal to the plurality of sub-pixels;
- a plurality of light emitting control lines located at the display area, electrically connected to the plurality of sub-pixels, and configured to provide a light emitting control signal to the plurality of sub-pixels;
- a plurality of groups of connecting lines located at least at the corner area, wherein each group of connecting lines of the plurality of groups of connecting lines comprises a plurality of connecting lines comprising:
  - a gate connecting line electrically connected to one of the plurality of gate lines, and
  - a light emitting control connecting line electrically connected to one of the plurality of light emitting control lines;
- a gate driving circuit located at least at the corner area and comprising a plurality of gate driving units connected to the plurality of gate lines through the gate connecting line in the plurality of groups of connecting lines;
- a light emitting control driving circuit located at least at the corner area, located on one side of the gate driving circuit away from the display area, and comprising a plurality of light emitting control driving units electrically connected to the plurality of light emitting control lines through the light emitting control connecting line in the plurality of groups of connecting lines,
- wherein an orthographic projection of each of the plurality of connecting lines on the base substrate passes between orthographic projections of two adjacent multiplexing units of the plurality of multiplexing units on the base substrate, and does not overlap with orthographic projections of the plurality of multiplexing units on the base substrate.

19. The array substrate according to claim 18, wherein the plurality of connecting lines further comprise a power connecting line, and the array substrate further comprises:
- a plurality of power lines located at the display area, electrically connected to the plurality of sub-pixels, and configured to provide a first power signal to the plurality of sub-pixels; and
- a first power bus located at the first peripheral area and the corner area, located between the gate driving circuit and the multiplexing circuit, and electrically connected to the plurality of power lines through the power connecting line in the plurality of groups of connecting lines.

20. A display device, comprising: the array substrate according to claim 1.

* * * * *

UNITED STATES PATENT AND TRADEMARK OFFICE
CERTIFICATE OF CORRECTION

PATENT NO. : 11,937,470 B2
APPLICATION NO. : 17/267883
DATED : March 19, 2024
INVENTOR(S) : Pengfei Yu It is certified that error appears in the above-identified patent and that said Letters Patent is hereby corrected as shown below:

On the Title Page

Column 2, Abstract, Line 4, before "plurality" insert -- a --

Signed and Sealed this
Fourth Day of June, 2024

Katherine Kelly Vidal
*Director of the United States Patent and Trademark Office*